United States Patent [19]
Horita et al.

[11] Patent Number: 6,034,422
[45] Date of Patent: Mar. 7, 2000

[54] LEAD FRAME, METHOD FOR PARTIAL NOBLE PLATING OF SAID LEAD FRAME AND SEMICONDUCTOR DEVICE HAVING SAID LEAD FRAME

[75] Inventors: Hideo Horita; Chiaki Hatsuta, both of Tokyo-To, Japan

[73] Assignee: Dai Nippon Printing Co., Ltd., Japan

[21] Appl. No.: 08/721,265

[22] Filed: Sep. 26, 1996

[30] Foreign Application Priority Data

| Sep. 29, 1995 | [JP] | Japan | 7-275076 |
| Oct. 17, 1995 | [JP] | Japan | 7-293278 |
| Nov. 17, 1995 | [JP] | Japan | 7-322523 |
| Nov. 17, 1995 | [JP] | Japan | 7-322524 |
| Feb. 20, 1996 | [JP] | Japan | 8-055315 |
| Feb. 20, 1996 | [JP] | Japan | 8-055316 |

[51] Int. Cl.[7] .................................. H01L 23/495
[52] U.S. Cl. .......................... 257/677; 257/666
[58] Field of Search .................. 257/677, 666, 257/678, 690

[56] References Cited

U.S. PATENT DOCUMENTS

| 4,883,774 | 11/1989 | Djennas et al. | 437/211 |
| 5,343,073 | 8/1994 | Parthasarathi et al. | 257/666 |
| 5,449,951 | 9/1995 | Parthasarathi et al. | 257/677 |

FOREIGN PATENT DOCUMENTS

| 60-1853 | 1/1985 | Japan . | |
| 60-218863 | 11/1985 | Japan | 257/677 |
| 61-63044 | 4/1986 | Japan | 257/677 |
| 62-163353 | 7/1987 | Japan . | |
| 63-69241 | 3/1988 | Japan . | |
| 1-18246 | 1/1989 | Japan . | |
| 1-115151 | 5/1989 | Japan . | |
| 1-257356 | 10/1989 | Japan . | |
| 2-84744 | 3/1990 | Japan . | |
| 2-185060 | 7/1990 | Japan . | |
| 3-177059 | 8/1991 | Japan . | |
| 3-222465 | 10/1991 | Japan . | |
| 4-7863 | 1/1992 | Japan . | |
| 4-83369 | 3/1992 | Japan . | |
| 4-137552 | 5/1992 | Japan . | |
| 4-184969 | 7/1992 | Japan . | |
| 5-67713 | 3/1993 | Japan . | |
| 7-503103 | 3/1995 | Japan . | |

*Primary Examiner*—Nathan K. Kelley
*Attorney, Agent, or Firm*—Parkhurst & Wendel, LLP

[57] ABSTRACT

A lead frame for a semiconductor device, made of a copper alloy, capable of preventing the creation of delamination between encapsuling resin and attributable to a lead frame without sacrificing the wire bondability and, a process for producing the lead frame and a semiconductor device using the lead frame. According to the present invention, (1) there is provided a lead frame for a plastic molded type semiconductor device, made of a copper alloy material partially plated with at least one noble metal, for wire bonding or die bonding purposes, selected from silver, gold, and palladium, wherein the whole area or a predetermined area of the surface of the copper at least on its side to be contacted with a encapsuling resin has a thin noble metal plating of at least one member selected from silver, gold, platinum, and palladium. (2) A copper strike plating is provided as a primer plating for the partial noble plating, a copper plating is provided on the thin noble metal plating, and the partial noble metal plating is provided on the copper plating in its predetermined area. (3) A die pad for mounting a semiconductor chip is provided, a partial silver plating is provided, and a zinc flash plating and a copper strike plating are provided in that order at least one on the surface of copper in the back surface of the die pad remote from the surface on which the semiconductor chip is mounted.

11 Claims, 20 Drawing Sheets

LEAD FRAME, METHOD FOR PARTIAL NOBLE PLATING OF SAID LEAD FRAME AND SEMICONDUCTOR DEVICE HAVING SAID LEAD FRAME

FIELD OF THE INVENTION

The present invention relates to a lead frame for a semiconductor device, and more particularly to a lead frame, made of a copper alloy material, improved particularly in strength of bond to a sealing resin.

DESCRIPTION OF THE PRIOR ART

A conventional plastic molded type semiconductor device (a plastic lead frame package) generally has a structure as shown in FIG. 20(a). Specifically, it comprises a die pad section 1011 for mounting thereon a semiconductor chip 1020, an outer lead section 1013 for electrical connection to a peripheral circuit, an inner lead section 1012 integral with the outer lead section 1013, a wire 1030 for electrically connecting a front end of the inner lead section 1012 to an electrode pad (a terminal) 1021 of a semiconductor chip 1020, a resin 1040 for sealing the semiconductor chip 1020 to protect the semiconductor chip 1020 against stress and contamination from an external environment, and the like. After the semiconductor chip 1020 is mounted on the die pad section 1011 or the like of a lead frame 1010, sealing with the resin 1040 is conducted to prepare a package. In this type of semiconductor device, the number of inner leads 1012 used should correspond to the electrode pads 1021 of the semiconductor chip 1020.

The lead frame 1010 used as an assembly member for such a (single layer) plastic molded type semiconductor device generally has a structure as shown in FIG. 20 (b). Specifically, it comprises: a die pad 1011 for mounting thereon a semiconductor chip; an inner lead 1012 for connection to a semiconductor chip provided around the die pad 1011; an outer lead 1013 provided continuously from the inner lead 1012 and adapted for connection to an external circuit; a dam bar 1014 which serves as a dam at the time of resin sealing; a frame section 1015 for supporting the whole lead frame 1010; and the like, in general, the lead frame has hitherto been made of a metal, having excellent conductivity, such as Kovar, 42 alloy (42% nickel-iron alloy), or a copper-base alloy, and shaped by pressing or etching.

The provision of a silver plating is required in a wire bonding area of the inner lead 1012 for connection to the semiconductor device, and, in general, after shaping, only a necessary area has been plated with silver to form a partial silver plating. Further, silver plating is necessary and has been provided on the surface, of the die pad 1011, to which a semiconductor device is die-bonded through a silver paste or the like. Here, silver plating on only an area required to be plated with silver, such as particularly a wire bonding area of the inner lead 1012 and a die bonding area of the die pad 1011, is referred to as "partial silver plating."

FIG. 20 (b) is a plan view of a lead frame 1010, and FIG. 20 (c) is a cross-sectional view taken on line F1–F2 of FIG. 20 (b).

In the conventional lead frame, as shown in FIG. 14 (a), a copper strike plating 135 and a silver plating 145 are successively formed on a lead frame material (a copper alloy) 120 in its areas of a die pad 111 on its side for mounting thereon a semiconductor chip, and a front end of an inner lead 112. The process of partial silver plating has been carried out as shown in FIG. 14 (b). Specifically, it comprises: the step (i) of pretreating a shaped lead frame material 120 by degreasing, pickling or the like; the step (ii) of providing an about 0.1 to 0.3 μm-thick(Cu) strike plating as a primer plating; the step (iii) of providing a 1.5 to 10 μm-thick silver plating on a desired area; and the step (iv) of, if necessary, electrolytically removing a thin silver (leaked silver or the like) deposited on an area requiring no silver plating and then conducting anti-discoloration treatment with an organic chemical, such as benzotriazole, to form a coating for preventing discoloration attributable to oxidation or hydroxylation.

Silver plating methods used in the art include a method wherein a predetermined area of a lead frame is covered using a masking jig followed by spraying of a silver plating solution on an exposed area to provide a partial silver plating and a method which comprises electrodepositing a resist on a lead frame, processing the electrodeposited resist to expose a predetermined area, and immersing the lead frame in a plating bath to conduct plating.

Plating on only a desired area of a lead frame using a masking jig or an electrodeposited resist as a mask in this way is called "partial plating," and silver plating shown in FIG. 14 is referred to as "partial silver plating."

Unlike the case where a copper plating is provided, as a primer plating for silver plating, on the surface of a lead frame made of 42 alloy (42%nickel-iron alloy), the copper primer plating, of the copper alloy frame, provided in this way, as such, has been used without being removed.

In recent years, however, also in the case of the copper alloy lead frame as treated above, delamination of the package created in the step of assembling a semiconductor device and the step of mounting has become a problem. In this case, it has been found that delamination, between an encapsuling resin and the back surface of a die pad, created in the case of a lead frame made of a copper alloy, is closely related to the method used for the surface treatment of the lead frame, assembly conditions and the like.

In general, the term "delamination" refers to separation or peeling created at interfaces within an IC package, between an IC chip and an encapsuling resin, between die bonding agent and an IC chip, between the surface of a die pad and a die bonding agent, between an encapsuling resin and the back surface of a die pad and other sites. This phenomenon is disadvantageous because it deteriorates the reliability of IC and the percentage non-defective in the step of IC assembly and the step of mounting.

The delamination of the copper alloy lead frame is considered attributable to the fact that an oxide film is formed on the surface of the copper alloy in the step of heat treatment in the course of IC assembly, the strength of bond between the formed oxide film and the metal being unsatisfactory.

On the other hand, Japanese Patent Laid-Open No. 503103/1995 discloses a lead frame which has been improved in strength of bond between the encapsuling resin and the back surface of the die pad and, in addition, between the encapsulating resin and the whole surface of the lead frame in order to prevent the creation of delamination. In the lead frame disclosed in this publication, the whole surface of the lead frame is thinly coated with a mixture of chromium with zinc or a single material of chromium or zinc from the viewpoint of improving the adhesion.

In this lead frame, however, since the silver plated area also is covered with the coating of other metals, stable gold wire bonding cannot be achieved.

Further, IC assembly conditions vary among IC makers, and the state of surface oxidation of the lead frame made of a copper alloy and the oxidation formation process also vary among the makers. Therefore, situations regarding the creation of delamination attributable to the lead frame vary among the IC assembly makers.

For example, regarding the anti-discoloration treatment wherein a benzotriazole coating is formed in order to prevent discoloration created by oxidation or hydroxylation of copper, a low IC assembly temperature is adopted for some makers, offering the effect of preventing the delamination, while a high IC assembly temperature is adopted for the other makers, making it impossible to attain the effect of preventing the delamination.

For this reason, at the present time, measures, for preventing the delamination, compatible with IC assembly conditions, are taken for each maker. Accordingly, the development of a method which can prevent delamination, attributable to a lead frame, independently of IC assembly conditions has been desired in the art.

SUMMARY OF THE INVENTION

In a lead frame made of a copper alloy, the prevention of delamination in a semiconductor device (IC) attributable to the formation of a copper oxide film on the surface of a lead frame has been desired from the viewpoint of preventing the deterioration of reliability of IC and the deterioration of percentage non-defective in the step of IC assembly and the step of mounting. In particular, the prevention of delamination, attributable to a lead frame, independently of IC assembly conditions has been desired in the art.

An object of the present invention is to provide a lead frame, made of a copper alloy, which, independently of IC assembly conditions, can prevent the creation of delamination attributable to a lead frame without sacrificing the wire bondability, and a process for producing the same. Another object of the present invention is to provide a semiconductor device using said lead frame.

According to one aspect of the present invention, there is provided a lead frame, for a plastic molded type semiconductor device, made of a copper alloy material partially plated with at least one noble metal, for wire bonding or die bonding purposes, selected from silver, gold, and palladium, wherein the whole area or a predetermined area of the surface of the copper at least on its side to be contacted with a encapsuling resin has a thin noble metal plating of at least one member selected from silver, gold, platinum, and palladium.

According to one preferred embodiment of the present invention, the thickness of the thin noble metal plating is not more than 0.5 μm and not less than 0.001 μm.

According to another preferred embodiment of the present invention, the partial noble metal plating is partial silver plating and the thin noble metal plating is thin silver plating.

In the lead frame made of a copper alloy, an about 0.1 to 0.3 μm-thick copper plating is generally formed as a primer plating, followed by partial silver plating.

According to another aspect of the present invention, there is provided a method for partial noble metal plating of a lead frame, for a plastic molded type semiconductor device, made of a copper alloy material partially plated with at least one noble metal, for wire bonding or die bonding purposes, selected from silver, gold, and palladium, a thin noble metal plating, of at least one member selected from silver, gold, platinum, and palladium, being provided on the whole area or a predetermined area of the surface of the copper at least on its side to be contacted with an encapsuling resin, the method comprising at least the steps of: partially forming a noble metal plating; electrolytically removing the noble metal plating in its portion deposited on an area requiring no noble metal plating; and thinly forming a noble metal plating.

According to one preferred embodiment of the present invention, the partial noble metal plating is conducted after plating of the surface of a lead frame material of a shaped copper alloy with copper. According to another preferred embodiment of the present invention, the thin noble metal plating is carried out by electroplating or electroless plating.

According to a further aspect of the present invention, there is provided a method for partial noble metal plating of a lead frame, for a plastic molded type semiconductor device, made of a copper alloy material partially plated with at least one noble metal, for wire bonding or die bonding purposes, selected from silver, gold, and palladium, a thin noble metal plating, of at least one member selected from silver, gold, platinum, and palladium, being provided on the whole area or a predetermined area of the surface of the copper at least on its side to be contacted with a encapsuling resin, the method comprising at least the steps of, in succession: (A) plating the surface of a lead frame material of a shaped copper alloy with copper; (B) thinly plating the whole area or a predetermined area of the surface of the copper-plated lead frame with a noble metal; and (C) partially plating the lead frame with a noble metal.

According to one preferred embodiment of the present invention, the thin noble metal plating is carried out by electroplating or electroless plating.

According to another preferred embodiment of the present invention, the partial noble metal plating is partial silver plating and the thin noble metal plating is thin silver plating.

According to a further aspect of the present invention, there is provided a semiconductor device comprising the above lead frame. According to one preferred embodiment of the present invention, in a copper oxide film formed in the whole area or a predetermined area of the lead frame at least on its surface to be contacted with an encapsuling resin, the concentration of the noble metal is not less than 0.1 at % and less than 20 at % as measured by X-ray photoelectron spectroscopy.

According to a further aspect of the present invention, there is provided a lead frame, for a plastic molded type semiconductor device, made of a copper alloy material, as a base material, partially plated with at least one noble metal, for wire bonding or die bonding purposes, selected from silver, gold, and palladium, a copper strike plating being provided as a primer plating for the partial noble metal plating, wherein the whole area or a predetermined area of the surface of the copper alloy material at least on its side to be contacted with an encapsuling resin has a thin noble metal plating of at least one member selected from silver, gold, platinum, and palladium, a copper plating is provided on the thin noble metal plating and the partial noble metal plating is provided on a predetermined area of the copper plating.

According to a further aspect of the present invention, there is provided a method for partial noble metal plating of a lead frame, for a plastic molded type semiconductor device, made of a copper alloy material, as a base materials partially plated with at least one noble metal, for wire bonding or die bonding purposes, selected from silver, gold, and palladium, a copper strike plating being provided as a primer plating for the partial noble metal plating, the method comprising at least the steps of, in succession:

(A) plating the whole area or a predetermined area of the surface of a lead frame material of a shaped copper alloy material with at least one member selected from silver, gold, platinum, and palladium to form a 0.001 to 0.5 µm-thick thin noble metal plating; (B) plating the whole area or at least an area including the partially noble metal plated area of the surface of the thin noble metal plated lead frame with copper; and (C) partially plating a predetermined area of the surface of the copper-plated lead frame with a noble metal.

According to a further aspect of the present invention, there is provide a lead frame, for a plastic molded type semiconductor device, made of a copper alloy material, provided with a die pad for mounting a semiconductor chip and partially plated with silver for wire bonding or die bonding purposes, wherein a zinc flash plating and a copper strike plating are provided in that order at least on the surface of copper in the back surface of the die pad remote from the surface on which the semiconductor chip is mounted.

According to a preferred embodiment of the present invention, the zinc flash plating or the copper strike plating as a primer plating for the silver plating is provided on the whole surface of the lead frame.

According to another preferred embodiment of the present invention, the thickness of the zinc flash plating is not less than 0.001 µm and not more than 0.5 µm.

According to the present invention, it is possible to provide a semiconductor device using a lead frame, made of a copper alloy, which, independently of IC assembly conditions, can prevent the creation of delamination attributable to a lead frame without sacrificing the bondability. Further, such a lead frame and a process for producing the same can also be provided.

The lead frame of the present invention can be produced by the method for partially plating a lead frame with a noble metal according to the present invention. In particular, according to the partial noble metal plating method, a thin noble metal plating can be evenly formed to a predetermined thickness. Further, when a thin noble metal plating and a copper plating are provided on the whole area of the lead frame, use of any masking jig is not required, simplifying plating operation for each plating.

DETAILED DESCRIPTION

Figure 1A:
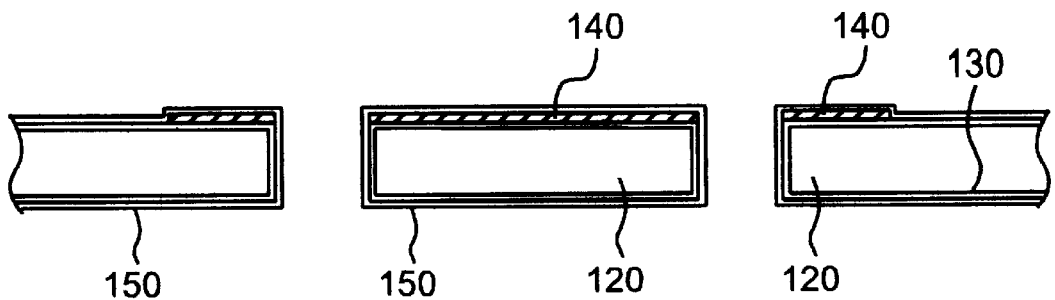
FIG. 1 is a diagram showing Example 1 of the lead frame according to the present invention, wherein FIG. 1 (b) is a plan view of the lead frame and FIG. 1 (a) is an enlarged view of the principal part in section taken on line A1–A2 of FIG. 1 (b)

By virtue of the above construction, the present invention can provide a lead frame, made of a copper alloy, which, independently of IC assembly conditions, can prevent the creation of delamination, of an encapsuling resin in a semiconductor device, attributable to a lead frame without sacrificing the bondability.

According to the present invention, by virtue of the provision of a thin noble metal plating of at least one member selected from silver, gold, platinum, and palladium on the whole area or a predetermined area of the copper surface at least on its side to be contacted with a sealing resin, the thin noble metal plating provided on the surface of copper can prevent oxidation of copper in the area thinly plated with the noble metal, thereby decreasing the thickness of the oxide film, and, in addition, at the time of formation of an oxide film, $Cu_2O$ is preferentially formed over CuO, so that the formed oxide film per se is less likely to be broken, preventing the delamination of the lead frame from a encapsuling resin. In particular, the effect is significant even when the thin noble metal plating is provided on the copper surface in the back surface of the die pad for mounting thereon a semiconductor chip.

The provision of a thin noble metal plating on the copper surface causes the noble metal to be diffused into the copper oxide film upon heating in the course of IC assembly, resulting in improved breaking strength of the copper oxide film and compensation for inherent poor adhesion of the noble metal to the encapsuling resin.

A thin noble metal plating thickness of not more than 0.5 μm and not less than 0.001 μm is suitable for attaining the effect of preventing delamination (separation or peeling).

When the thickness of the thin noble metal plating is not more than 0.001 μm, the above effect cannot be attained. On the other hand, a thickness exceeding 0.5 μm results in increased plating time and cost and, at the same time, causes unsatisfactory diffusion of the noble metal into the copper oxide film in the course of IC assembly, probably resulting in lowered strength of bond between the lead frame and the encapsuling resin.

The structure of the lead frame of the present invention does not influence the gold wire bondability.

The solderability of the lead frame according to the present invention is good and comparable to that of the conventional lead frame because the copper oxide film is removed by pickling or chemical polishing as a pretreatment for soldering.

When the partial noble metal plating is partial silver plating with the thin noble metal plating being thin silver plating, plating can be relatively simply and stably performed by the conventional electroplating or electroless plating, resulting in lowered production cost.

By virtue of the above constitution, the method for partially plating a lead frame with silver according to the present invention enables the production of the lead frame of the present invention.

Specifically, since the process comprises at least the steps of partially plating a lead frame with a noble metal, electrolytically removing a noble metal leak portion, and then applying a thin noble metal plating, that is, since a thin noble metal plating is formed after electrolytically removing a partial noble metal plating leak portion thinly deposited, on an area requiring no partial noble metal plating, in the formation of the noble metal plated area, a thin noble metal film can be formed with no significant variation within an identical plane. The provision of the thin noble metal plating by electroplating or electroless plating can simplify the regulation of the thickness of the thin noble metal plating.

Further, the process comprising at least the steps of, in succession: (A) plating the surface of a lead frame material of a shaped copper alloy with copper; (B) thinly plating the whole area or a predetermined area of the surface of the copper-plated lead frame with a noble metal; and (C) partially plating the lead frame with a noble metal, enables a thin noble metal plating to be formed on the copper surface without influence of the partial noble metal plating. The provision of the thin noble metal plating by electroplating or electroless plating can simplify the regulation of the thickness of the thin noble metal plating.

When the thin noble metal plating is provided on the whole area of the lead frame, including the partially noble metal plated area, the operation for the thin noble metal plating can be simplified.

When the partial noble metal plating is partial silver plating with the thin noble metal plating being thin silver plating, plating can be relatively simply and stably performed by the conventional electroplating or electroless plating. At the same time, the production cost can be made lower than that in the case of gold plating or platinum plating.

In the semiconductor device according to the present invention, when the above lead frame according to the present invention is used, a surface area having a region of at least one of silver, gold, palladium, and platinum and a copper oxide film in the whole area or a predetermined area of the surface of the lead frame to be contacted with a encapsuling resin can be formed through heat treatment in the step of wire bonding, preventing separation of the lead frame its area in contact with the encapsuling resin after molding of the encapsuling resin.

In a copper oxide film formed in the whole area or a predetermined area of the lead frame at least on its surface to be contacted with a encapsuling resin, when the concentration of the noble metal is not less than 0.1 at % as measured by X-ray photoelectron spectroscopy, the breaking strength of the copper oxide film or in the interface of the copper oxide film and the copper alloy is satisfactory. Further, when it is less than 20 at %, the inherent poor adhesion of the noble metal to the encapsuling resin can be compensated, resulting in satisfactory adhesion between the copper oxide film and the encapsuling resin.

The lead frame according to a further aspect of the present invention is a lead frame, for a plastic molded type semiconductor device, made of a copper alloy material partially plated with at least one noble metal, for wire bonding or die bonding purposes, selected from silver, gold, and palladium, a copper strike plating being provided as a primer plating for the partial noble metal plating, wherein the whole area or a predetermined area of the surface of the copper alloy material at least on its side to be contacted with a encapsuling resin has a thin noble metal plating of at least one member selected from silver, gold, platinum, and palladium, a copper plating is provided on the thin noble metal plating and the partial noble metal plating is provided on a predetermined area of the copper plating.

The method for partial noble metal plating of a lead frame according to a further aspect of the present invention is a method for partial noble metal plating of a lead frame, for a plastic molded type semiconductor device, made of a copper alloy material, as a base material, partially plated with at least one noble metal, for wire bonding or die bonding purposes, selected from silver, gold, and palladium, a copper strike plating being provided as a primer plating for the partial noble metal plating, the method comprising at least the steps of, in succession: (A) plating the whole area or a predetermined area of the surface of a lead frame material of a shaped copper alloy material with at least one member selected from silver, gold, platinum, and palladium to form a 0.001 to 0.5 μm-thick thin noble metal plating; (B) plating the whole area or at least an area including the partially noble metal plated area of the surface of the thin noble metal plated lead frame with copper; and (C) partially plating a predetermined area of the surface of the copper-plated lead frame with a noble metal.

In the present invention, since the thin noble metal plating underlies the copper plating, subsequent noble metal plating step and wire bonding step may be carried out in the same manner as in the prior art. In this case, neither a problem of adhesion of the noble metal nor a problem of wire bondability occurs.

Figure 14A:
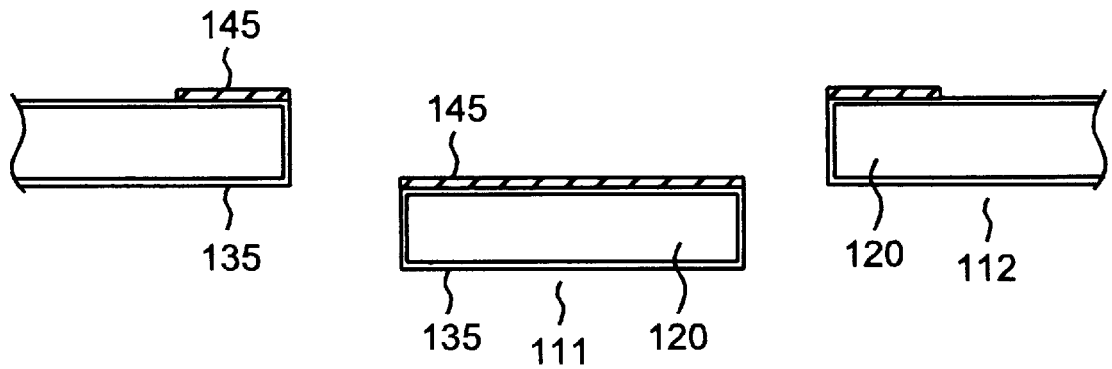
FIG. 14 is a diagrams showing partial silver plating of a conventional lead frame, wherein FIG. 14 (a) is a cross-sectional view of a lead frame and FIG. 14 (b) is a diagram showing a plating process.
Figure 14B:
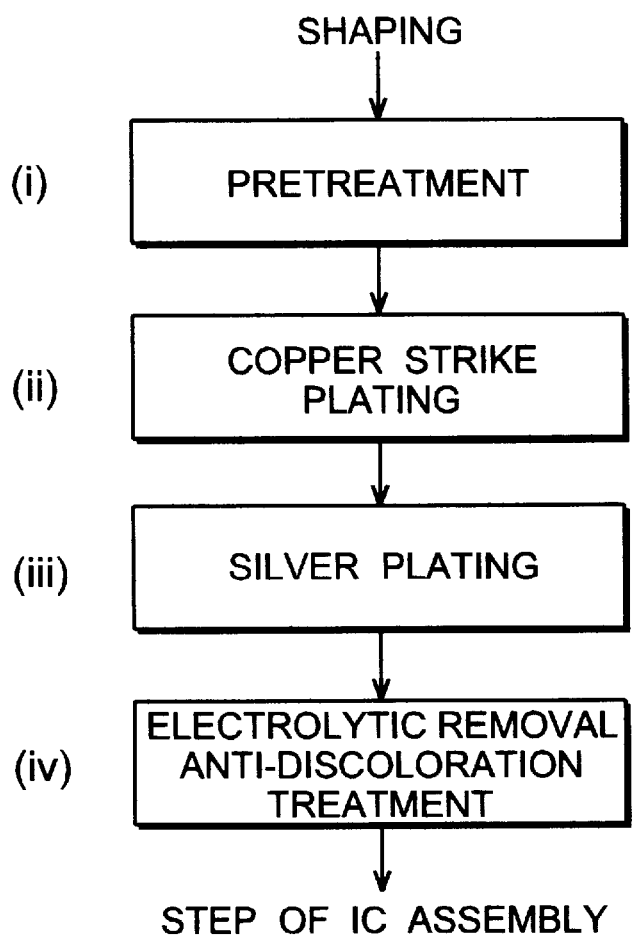

The solderability of the lead frame according to the present invention is good and comparable to that of the conventional lead frame shown in FIG. 14 (*a*) because the copper oxide film is removed by pickling or chemical polishing as a pretreatment for soldering.

In the partial noble metal plating, noble metal frequently leaks into an area requiring no noble metal plating, and, in some cases, the leaked noble metal is electrolytically removed. In this case, since a thin noble metal plating underlies the copper plating, the leaked noble metal alone can be removed without influence on the thin noble metal plated area.

Further, since the thin noble metal plating underlies the copper plating, the same appearance as that in the conventional lead frame shown FIG. 14 (*a*) can be ensured.

When the partial noble metal plating is partial silver plating with the thin noble metal plating being thin silver plating, plating can be relatively simply and stably preformed by the conventional electroplating or electroless plating, resulting in lowered production cost. At the same time, the production cost is lower than that in the case of gold plating or platinum plating.

By virtue of the above constitution, the method for partially plating a lead frame with a noble metal according to the present invention enables the production of the lead frame of the present invention.

The provision of the thin noble metal plating by electroplating or electroless plating can simplify the regulation of the thickness of the thin noble metal plating.

Further, when a thin noble metal plating and a copper plating are provided on the whole area of the lead frame, use of any masking jig is not required, simplifying the operation for the formation of each plating.

The thin noble metal plating may be formed by any of electroplating and electroless plating. However, when regulation of the plating thickness with good accuracy by increasing the plating rate is desired, the electroplating is suitable. On the other hand, good throwing power of the plating on a lead frame having a complicated shape is required, electroless plating is suitable.

The lead frame according to a further aspect of the present invention is a lead frame, for a plastic molded type semiconductor device, made of a copper alloy material, provided with a die pad for mounting a semiconductor chip and partially plated with silver for wire bonding or die bonding purposes, wherein a zinc flash plating and a copper strike plating are provided in that order at least on the surface of copper in the back surface of the die pad remote from the surface on which the semiconductor chip is mounted.

According to the present invention, the provision of a zinc flash plating and a copper strike plating in that order at least on the copper surface of the back surface of the die pad remote from the surface on which a semiconductor chip is mounted, can prevent delamination (peeling or separation) attributable to the copper oxide film at least on the surface of the lead frame in the back surface of the die pad. Further, the provision of a zinc flash plating and a copper strike plating, as a primer plating for silver plating, on the whole surface of the lead frame can prevent delamination (peeling or separation) attributable to the copper oxide film on the surface of the lead frame in all interfaces of the lead frame, including the back surface of the die pad, and the encapsuling resin. Furthermore, use of any jig for plating or the like is not required as opposed to the case where the partial plating is provided on only the back surface of the die pad.

A thickness of the zinc flash plating of not more than 0.5 $\mu$m and not less than 0.001 $\mu$m can offer the effect of preventing delamination (peeling or separation).

When the thickness of the zinc flash plating is less than 0.001 $\mu$m, the concentration of zinc diffused into the copper strike plating is so low that the improvement in adhesion of the oxide film is unsatisfactory and the use of such a lead frame cannot prevent delamination, whereas when it is not less than 0.001 $\mu$m, the creation of delamination (peeling or separation) attributable to the copper oxide film on the surface of the lead frame can be prevented. When the thickness of the zinc flash plating is larger than 0.5 $\mu$m, the cost is increased. Further, in this case, for zinc flash plating onto the whole surface of the lead frame, at the time of armor plating, there is a possibility that an acicular crystal of tin (Sn) containing the armor plating is formed in the outer lead, lead to a fear of a short circuit being created between outer leads.

Since the zinc flash plating underlies the copper strike plating, subsequent silver plating step and wire bonding step may be carried out in the same manner as in the prior art. In this case, neither a problem of adhesion of the silver plating nor a problem of wire bondability occurs.

DESCRIPTION OF PREFERRED EMBODIMENTS

Present invention will be described with reference to the following examples and comparative examples.

EXAMPLE 1

Figure 1B:
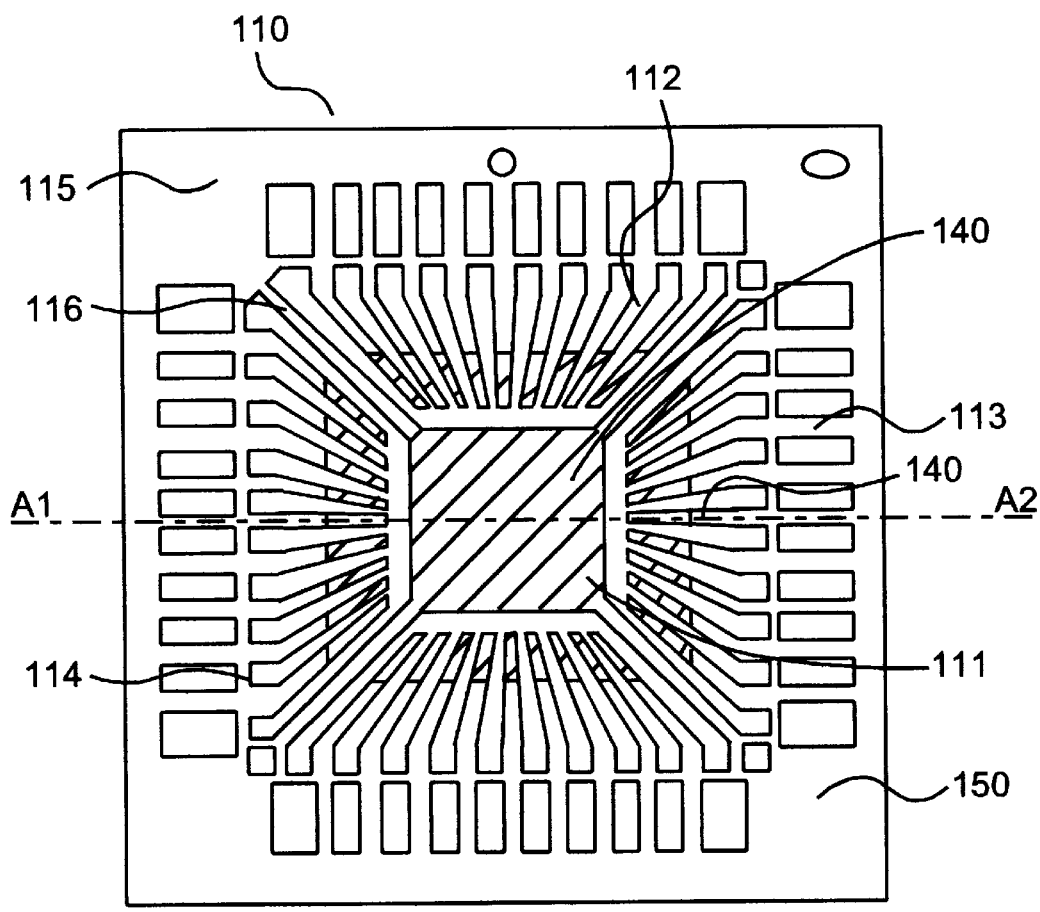

FIG. 1 shows an embodiment of the lead frame of the present invention, wherein FIG. 1 (*b*) is a plan view of the lead frame and FIG. 1 (*a*) is an enlarged view of the principal part in section taken on line A1–A2 of FIG. 1 (*b*).

In FIG. 1, numeral 110 designates a lead frame, numeral 111 a die pad, numeral 112 an inner lead, numeral 113 an outer lead, numeral 114 a dam bar, numeral 115 a frame, numeral 116 a supporting bar, numeral 120 a lead frame material (a copper alloy), numeral 130 a copper plating, numeral 140 a partial silver plating, and numeral 150 a thin silver plating.

In the lead frame 110, a 0.15 mm-thick copper alloy material (EFTEC64T-1/2H material, manufactured by The Furukawa Electric Co., Ltd.) is etched to prepare a lead frame material 120 having an external shape as shown in FIG. 1 (*b*), the whole surface of the lead frame material 120 is plated with copper 130, and only a predetermined area of the copper plating 130 is plated with silver to form a partial silver plating 140, and the whole surface is thinly plated with silver to form a thin silver plating 150.

In this embodiment, the plating thickness is 0.1 $\mu$m for the copper plating, 3 $\mu$m for the partial silver plating, and 0.01 $\mu$m for the thin silver plating. It is preferably 0.1 to 0.3 $\mu$m for the copper plating, 1.5 to 10 $\mu$m for the partial silver plating, and 0.001 to 0.5 $\mu$m for the thin silver plating.

Figure 19A:
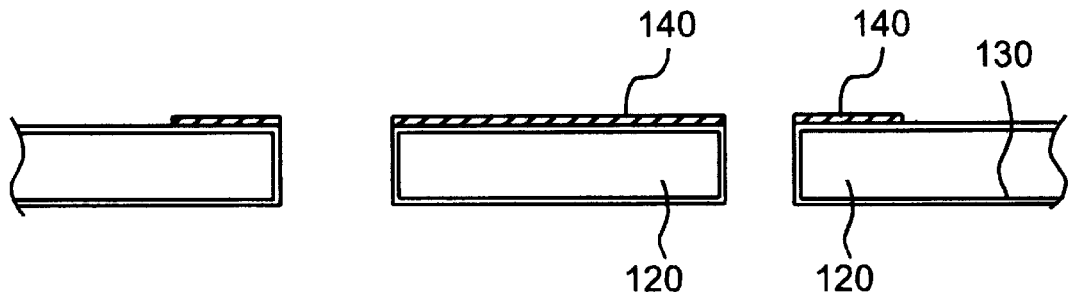
FIG. 19 is a schematic view of a conventional lead frame, wherein FIG. 19 (b) is a plan view of the lead frame and FIG. 19 (a) is an enlarged view of the principal part in section taken on line B1–B2 of FIG. 19 (b)
Figure 19B:
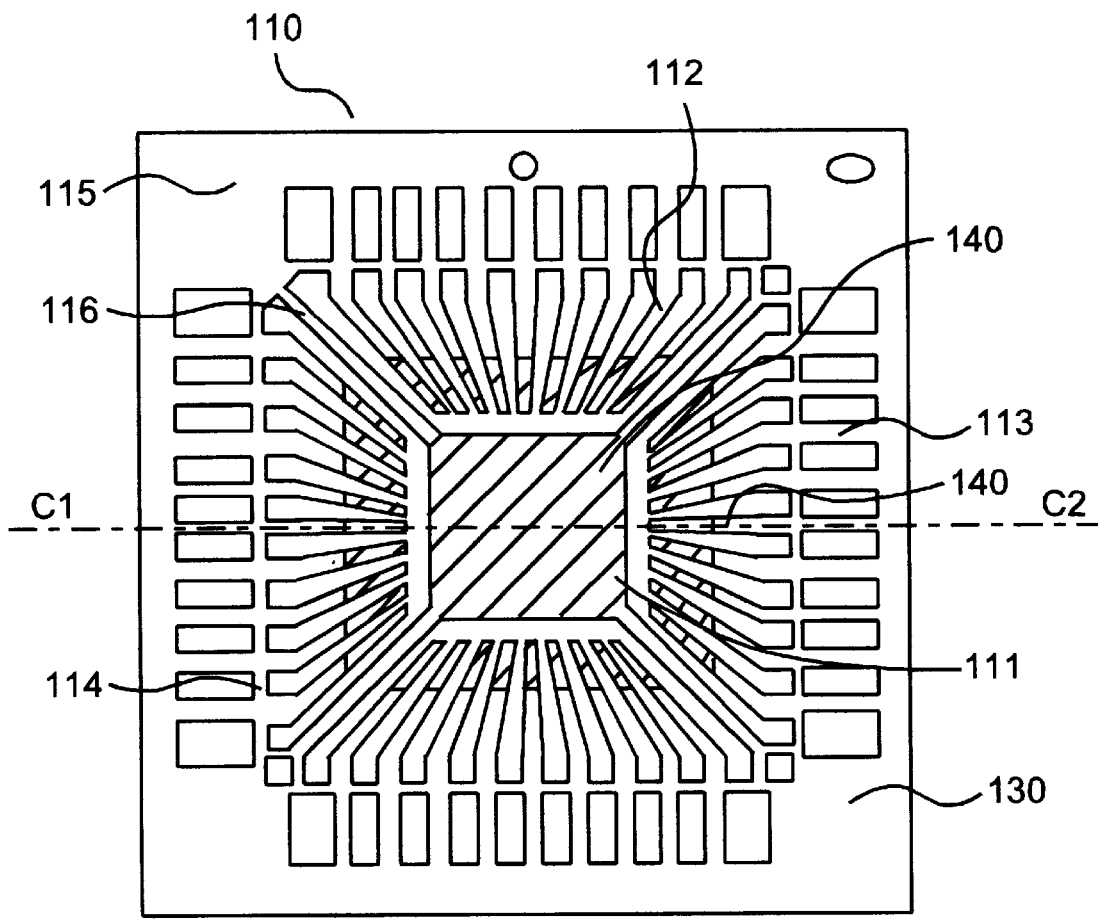
Figure 20A:
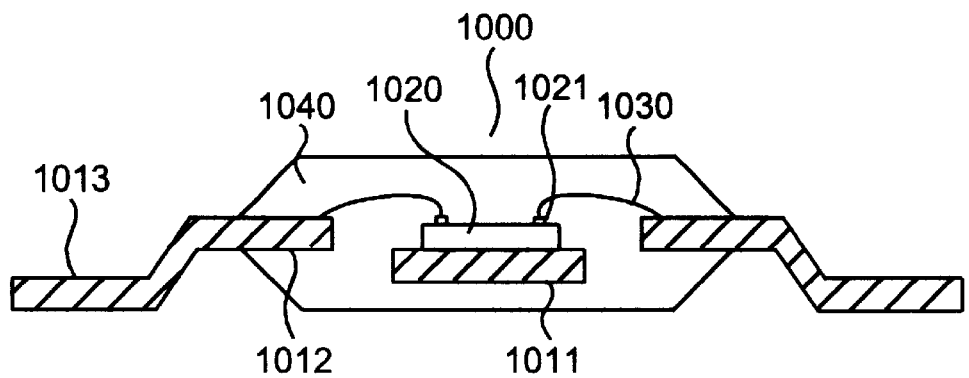
FIG. 20 is an explanatory view of a conventional semiconductor device and a conventional lead frame, wherein FIG. 20 (a) is a diagram showing the sectional structure thereof, FIG. 20 (b) is a plan view and FIG. 20 (c) is a sectional view taken on line F1–F2 of FIG. 20 (b).
Figure 20B:
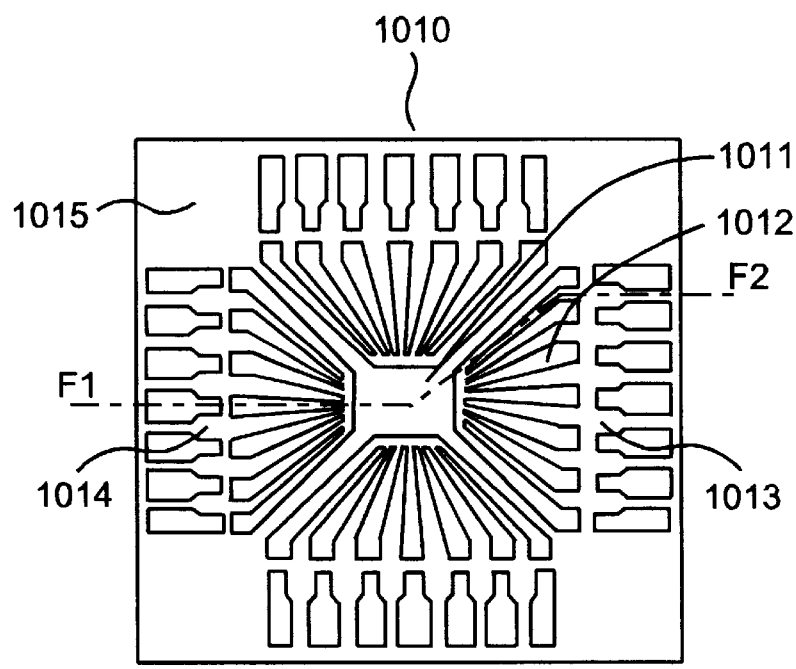
Figure 20C:
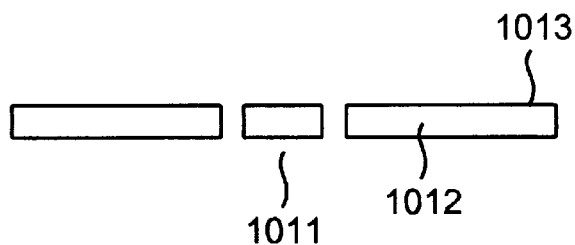

Further, in this embodiment, EFTEC64T-1/2H material manufactured by The Furukawa Electric Co., Ltd. is used as the lead frame material. However, the lead frame material is not limited to this material only, and other copper alloys may be used. As shown in FIG. 19, the conventional lead frame comprises a shaped lead frame material 120, a copper plating 130 provided on the whole surface of the shaped lead frame material 120, and a partial silver plating 140 provided on the copper plating 130 in its predetermined area alone, whereas the lead frame according to the present embodiment is provided with a thin silver plating 150. The provision of the thin silver plating 150 can prevent the oxidation of the copper plating 130 to decrease the thickness of en oxide film. In addition, at the time of oxidation, it results in the preferential formation of $Cu_2O$ over CuO, so that the formed oxide film per se is less likely to be broken and, consequently, when a semiconductor device is prepared using this lead frame, the occurrence of delamination from an encapsuling resin can be prevented.

A process for producing a semiconductor device (IC package) using the lead frame of Example 1 will be described with reference to FIG. 5.

At the outset, a die pad 111 of a lead frame 110 of the present embodiment shown in FIG. 1 is subjected to down setting (FIG. 5 (a)), and a semiconductor chip 160 is joined onto the die pad 111 through a silver paste 170 (FIG. 5 (b)).

Subsequently, the silver paste 170 is heat-cured, and an electrode pad (terminal) 161 of the semiconductor chip 160 is wire-bonded and electrically connected, using a wire (a gold wire) 180, to the front end of an inner lead 112 provided with a partial silver plating 140 in the lead frame 110 (FIG. 5 (c)).

Subsequently, resin sealing, removal of the dam bar, forming of the outer lead, and soldering are performed to prepare a semiconductor device 200 (FIG. 5 (d)).

Through the above steps, the copper plating 130 on the surface of the lead frame 110 shown in FIG. 1 and a part of the lead frame material (copper alloy) 120 are oxidized to form a copper oxide film 130A shown in FIG. 5 (c), At the same time, the thin silver plating 150 on the copper plating 130 shown in FIG. 1 is diffused into the copper oxide film 130A and the lead frame material (copper alloy) 120.

Figure 6A:
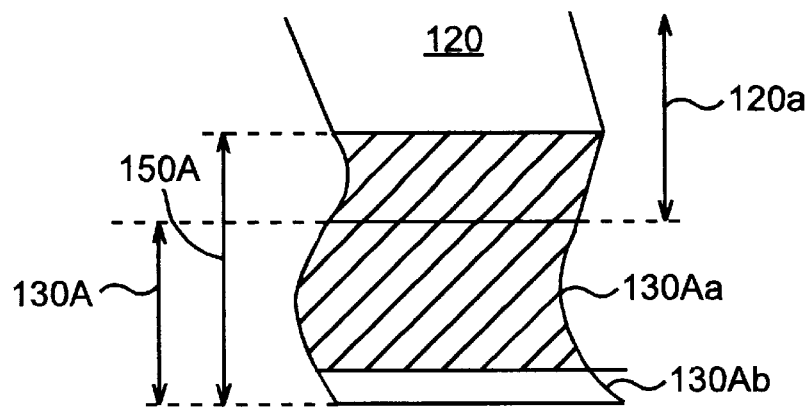
FIG. 6 is a diagram showing the state of a copper oxide film on a lead frame material.
Figure 6B:
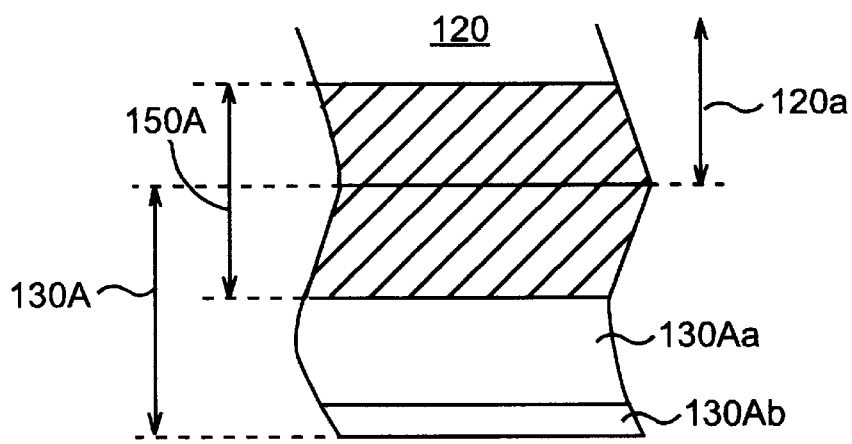
Figure 6C:
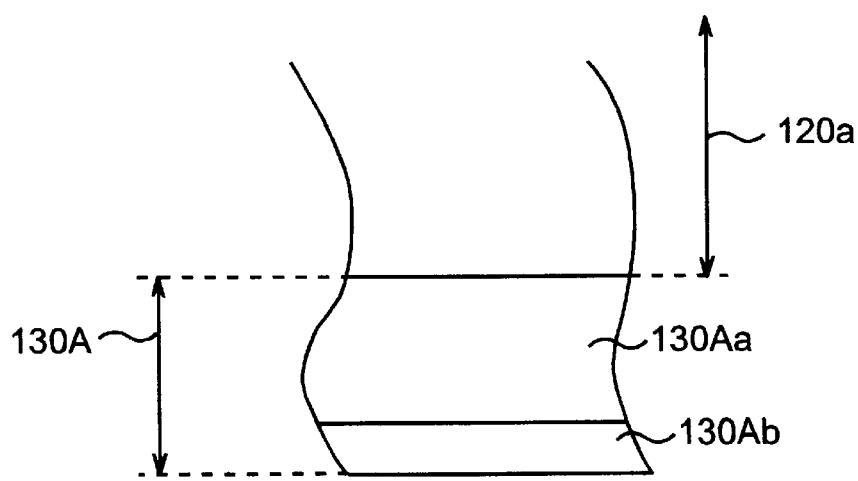

In the preparation of the semiconductor device 200 using the lead frame of the present embodiment, upon heating in the step shown in FIG. 5 (c), the surface of copper in the die pad 111 observed by X-ray photoelectron spectroscopy (ESCA) is as shown in FIGS. 6 (a) and 6 (b).

In FIG. 6, numeral 130A designates a copper oxide film, numeral 150A a region with silver diffused thereinto, numeral 120 a lead frame material, and numeral 12a a copper alloy.

Silver of the thin silver plating 150 shown in FIG. 1 is diffused into the copper oxide film 130A and the copper lead frame material (copper alloy), and, as shown in FIG. 6 (a), Ag is diffused into the whole copper oxide film region 130A and a part of the copper alloy 120a. The copper oxide film region 130A is constituted by CuO 130Ab and $Cu_2O$ 130Aa with the CuO 130Ab on the top surface side.

Upon further diffusion of Ag, Ag migrates toward the inner side of the copper alloy, and, as shown in FIG. 6 (b), this renders the diffused Ag substantially absent in the surface area. The state of diffusion of Ag into the inner side of the copper oxide film varies depending upon the thickness of the thin silver plating 150 and heating conditions. Specifically, when the thickness of the thin silver plating 150 is somewhat large and heating conditions are mild, silver is likely to be diffused into substantially the whole area of the oxide film on the other hand, when the thickness of the silver plating is small and heating conditions are severe, silver is likely to be diffused deeply into the interior of the copper oxide film. In some cases, silver is diffused into the oxide film, as well as into the lead frame material (copper alloy) 120.

When the thickness of the thin silver plating 150 and heating conditions are appropriate, the observation of the surface by ESCA or the like reveals that the surface of the copper oxide film is also constituted by cuprous oxide $Cu_2O$.

On the other hand, when a semiconductor device is prepared, through the same steps as shown in FIG. 5, using the conventional lead frame, shown in FIG. 19, with copper plating and partial silver plating alone being provided, the state of oxidation of copper in the state corresponding to FIG. 5 (c) is as shown in FIG. 6 (c).

In the conventional lead frame shown in FIG. 19, since no thin silver plating is provided on the surface of copper, the oxidation rate of copper is so high that the thickness of the resultant oxide film is larger than that of the oxide film in the present embodiment. In addition, since there is no diffusion of silver, unlike the use of the lead frame of the present embodiment, preferential formation of $Cu_2O$ over CuO does not occur.

From FIG. 6, it is apparent that, in the lead frame 110 according to the present embodiment, the provision of the thin silver plating 140 can prevent the formation of an oxide film in the step shown in FIG. 5 (a), resulting in a smaller thickness of the oxide film than that of the oxide film in the prior art where no thin silver plating 140 is provided.

Further, in the lead frame 110 of the present embodiment, at the time of formation of the oxide film, $Cu_2O$ is preferentially formed over CuO, so that the formed oxide film per se is less likely to be broken and, consequently, when a semiconductor device is prepared using this lead frame, the occurrence of delamination of the lead frame from a encapsuling resin can be prevented.

Lead frames wherein the thickness of the thin silver plating is 0.001 µm, 0.01 µm, and 0.5 µm were prepared as variants of Example 1. For the lead frames of Example 1 and the variants thereof, the adhesion of the copper oxide film on the back surface of the die pad of the lead frames and the bond strength of a encapsuling resin were evaluated.

In the evaluation of the adhesion of the copper oxide film on the back surface of the die pad, the lead frame was heated under wire bonding simulated heating conditions of 280° C. and 3 min, the bond strength of the oxide film on the back surface of the die pad was measured by a tape peeling test, and, when no peeling occurred, the adhesion was evaluated as acceptable (O), while peeling occurred, the adhesion was evaluated as unacceptable (X).

In the evaluation of the bond strength of the encapsuling resin, special frames (a solid plate), for the evaluation of the bond strength of a encapsuling resin, which has been subjected to surface treatment in the same manner as in Example 1 and variants thereof, were compared with the special frame which has been subjected to the conventional surface treatment. The results are given in Table 1.

In the comparison test, both the frames of invention and the comparative frame have no partial silver plating. These special frames were heated under wire bonding simulated heating conditions of 280° C. and 3 min, a encapsuling resin having a given area was molded on the copper alloy material, and the bond strength of the encapsuling resin was measured by a shear test.

The bond strength of the encapsuling resin was evaluated as acceptable (O) when the strength was not less than 2.0

N/mm², while the bond strength was evaluated as unacceptable (X) when the bond strength was less than 2.0 N/mm².

In the comparative example, the thickness of the thin silver plating was 1.0 μm. In the conventional example, no thin silver plating was provided.

TABLE 1

| Example | Thickness of thin Ag plating, μm | Adhesion of copper oxide film on the back surface of die pad | Adhesion of encapsuling resin |
|---|---|---|---|
| Variant 1 | 0.001 | ○ | ○ |
| Ex. 1 | 0.01 | ○ | ○ |
| Variant 2 | 0.1 | ○ | ○ |
| Variant 3 | 0.5 | ○ | ○ |
| Comp. Ex. 1 | 1.0 | ○ | X |
| Comp. Ex. 2 (conventional example) | No thin Ag plating provided | X | X |

In Example 1, thin silver plating has been provided on the whole surface of the copper alloy material after predetermined partial silver plating. However, partial thin silver plating on only a portion useful for preventing the delamination of an IC package, for example, partial thin silver plating on only the back surface of the die pad suffices for attaining the effect of preventing the delamination (prevention of separation or peeling by oxidation).

EXAMPLE 2

Figure 2A:
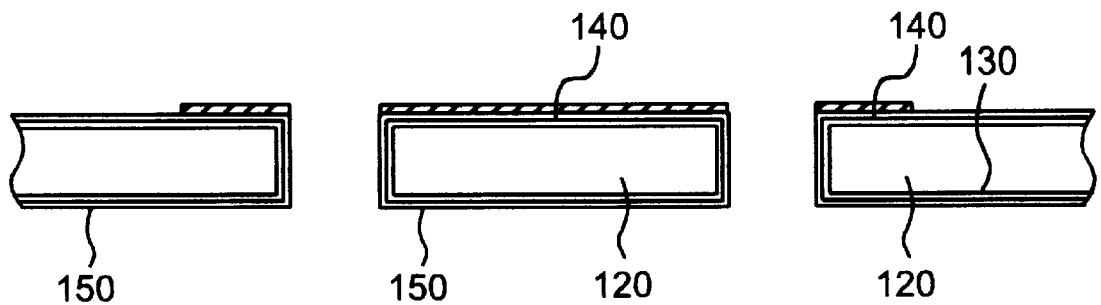
FIG. 2 is a diagram showing Example 2 of the lead frame according to the present invention, wherein FIG. 2 (b) is a plan view of the lead frame and FIG. 2 (a) is an enlarged view of the principal part in section taken on line B1–B2 of FIG. 2 (b)
Figure 2B:
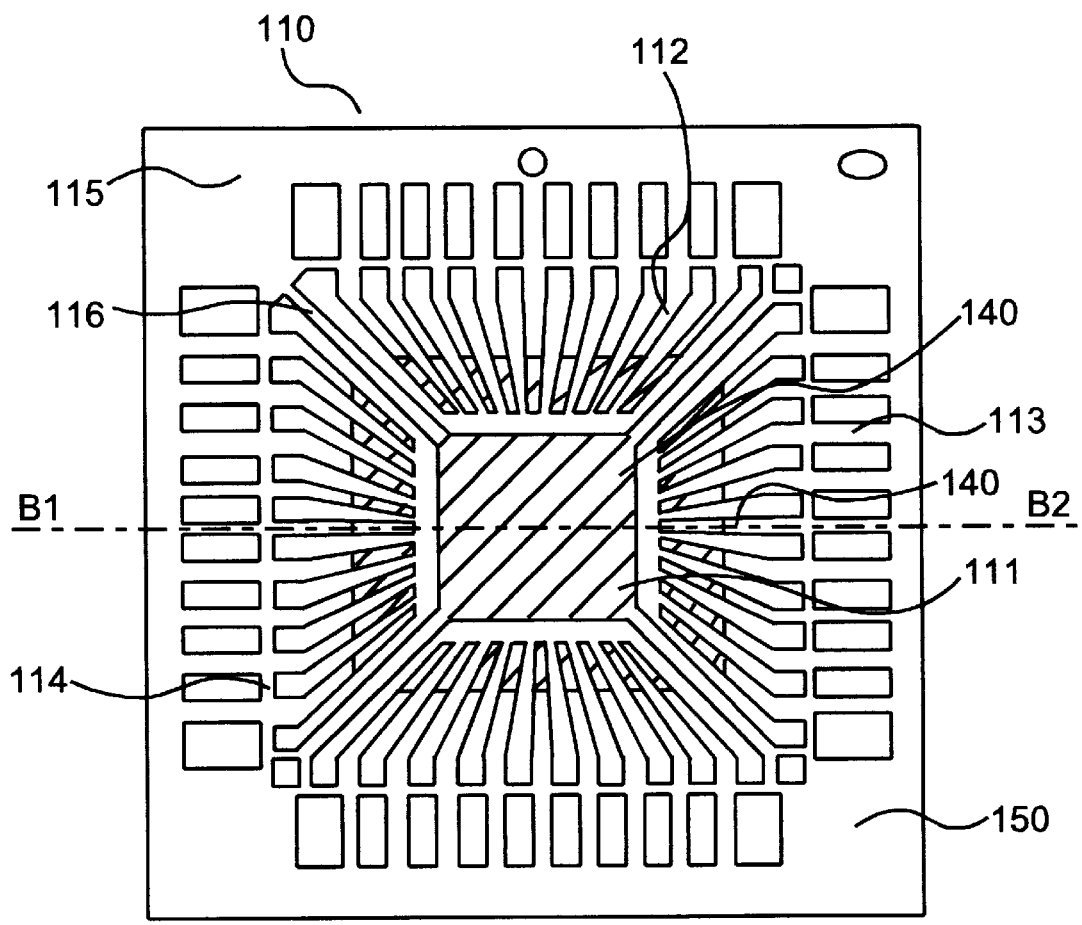
Figure 3A:
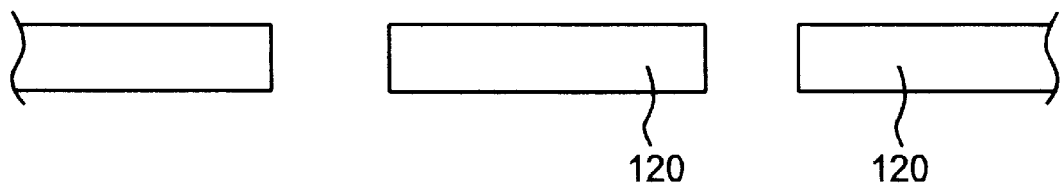
FIG. 3 is a diagram showing steps involved in a method of partially plating the lead frame of Example 1.
Figure 3B:
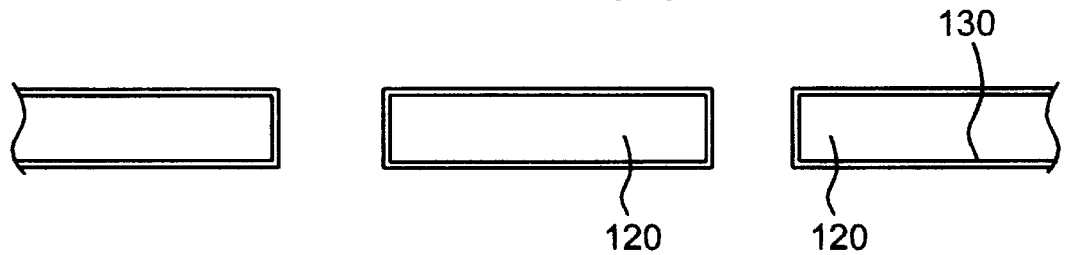
Figure 3C:
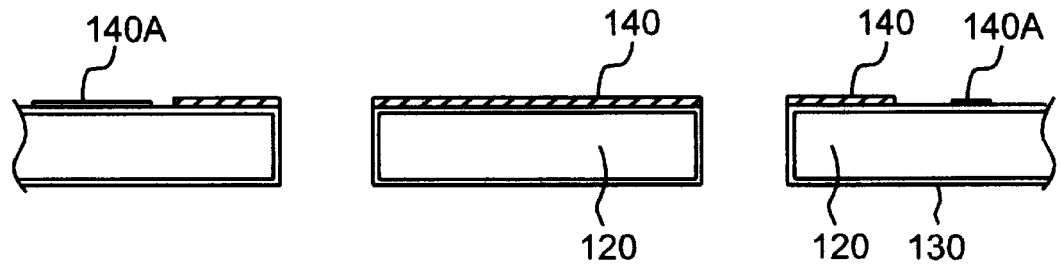
Figure 3D:
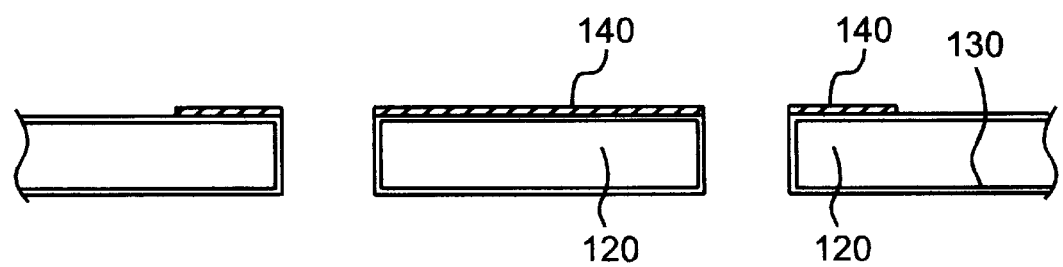
Figure 3E:
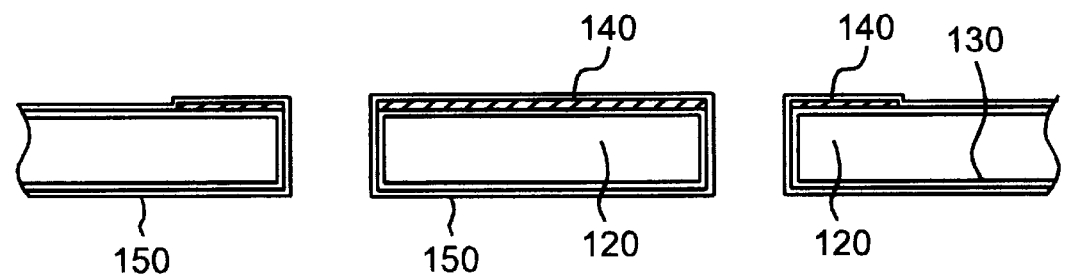
Figure 4A:
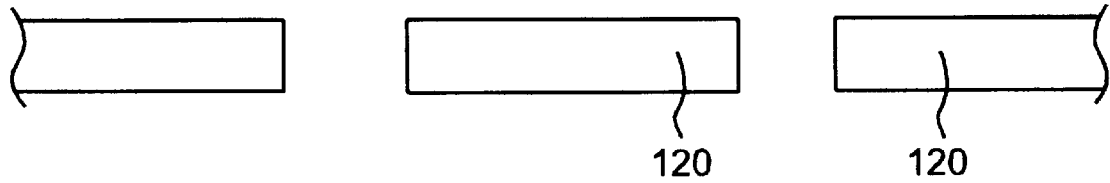
FIG. 4 is a diagram showing steps involved in a method of partially plating the lead frame of Example 2.
Figure 4B:
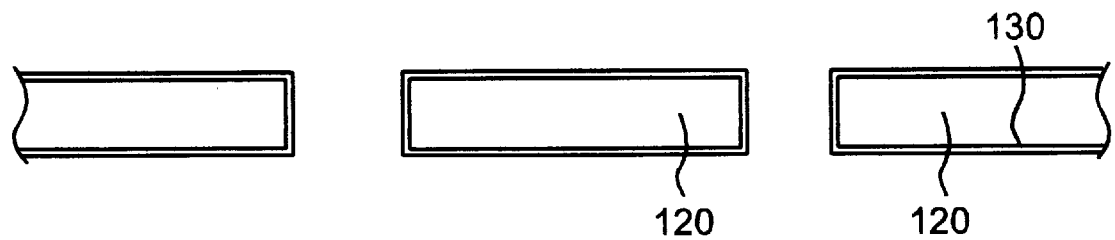
Figure 4C:
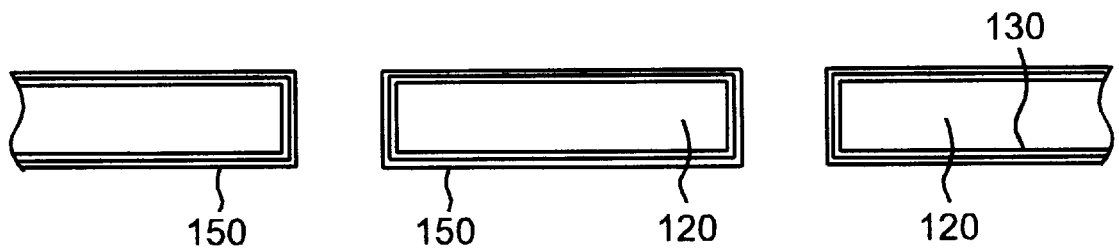
Figure 4D:
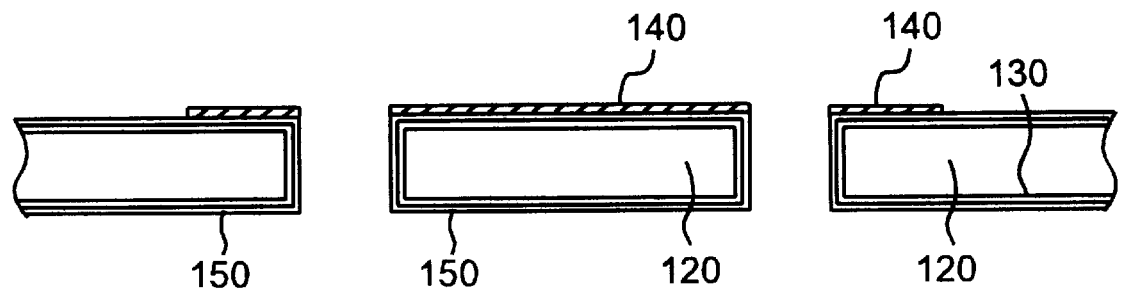
Figure 5A:
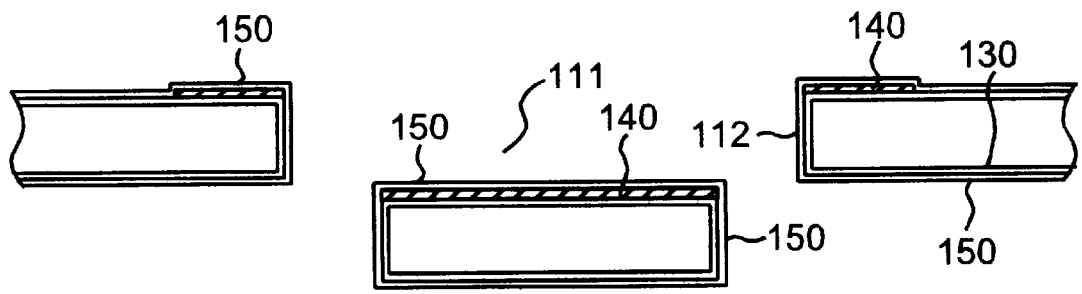
FIG. 5 is a diagram illustrating a process for producing a semiconductor device using the lead frame of Example 1 according to the present invention.
Figure 5B:
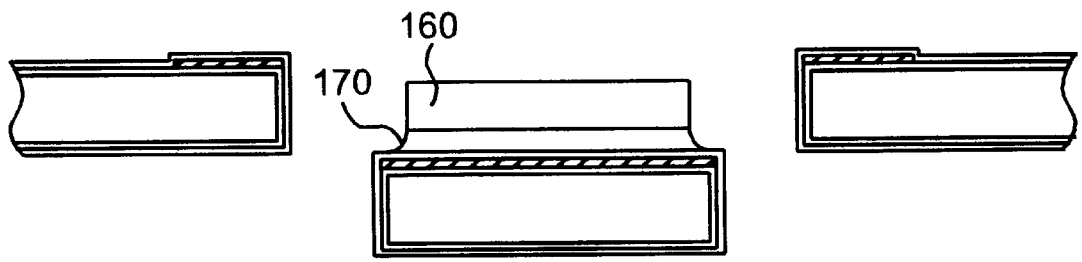
Figure 5C:
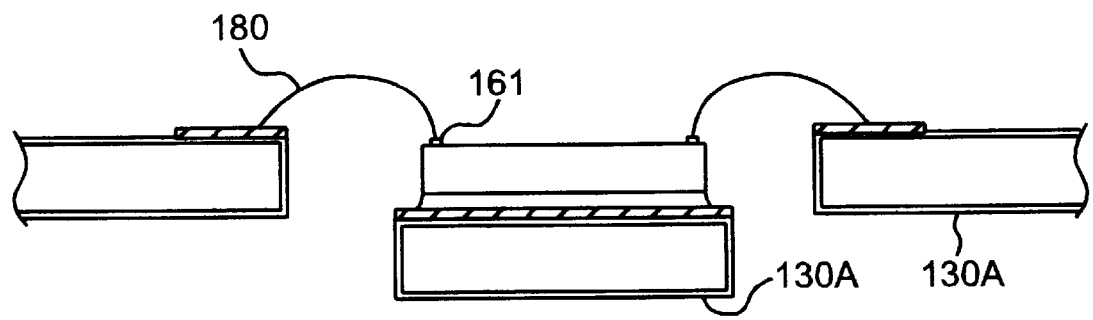
Figure 5D:
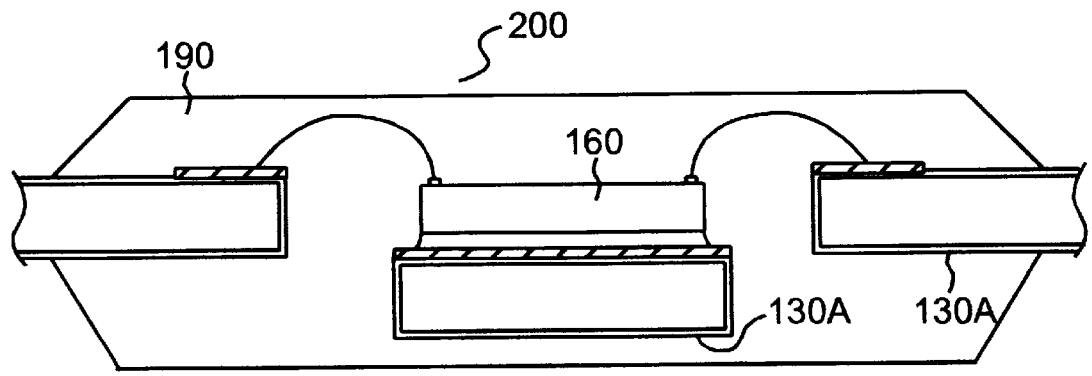

FIG. 2 shows an embodiment of the lead frame of the present invention, wherein FIG. 2 (b) is a plan view of the lead frame and FIG. 2 (a) is an enlarged view of the principal part in section taken on line B1–B2 of FIG. 2 (b).

In FIG. 2, numeral 110 designates a lead frame, numeral 111 a die pad, numeral 112 an inner lead, numeral 113 an outer lead, numeral 114 a dam bar, numeral 115 a frame, numeral 120 a lead frame material (a copper alloy), numeral 130 a copper plating, numeral 140 a partial silver plating, and numeral 150 a thin silver plating.

In the lead frame 110, a 0.15 mm-thick copper alloy material (EFTEC64T-1/2H material, manufactured by The Furukawa Electric Co., Ltd.) is etched to prepare a lead frame material 120 having an external shape as shown in FIG. 1 (b), the whole surface of the lead frame material 120 is plated with copper 130, and the whole surface of the copper plating is plated with silver to form a thin silver plating 150, and, further, a predetermined area of the silver plating is plated with silver to form a partial silver plating 140.

In this embodiment, the plating thickness is 0.1 μm for the copper plating, 0.01 μm for the thin silver plating, and 3 μm for the partial silver plating. As with the lead frame of Example 1, the plating thickness is preferably 0.1 to 0.3 μm for the copper plating, 1.5 to 10 μm for the partial silver plating, and 0.001 to 0.5 μm for the thin silver plating.

Further, in this embodiment, EFTEC64T-1/2H material manufactured by The Furukawa Electric Co., Ltd. is used as the lead frame material. As with Example 1, however, the lead frame material is not limited to this material only, and other copper alloys may be used.

The results of evaluation on the adhesion of the copper oxide film on the back surface of the die pad and the bond strength of the encapsuling resin, associated with the provision of the thin silver plating, were the same as those of Example 1.

EXAMPLE 3

A process for partially plating a lead frame according to the present invention will be described with reference to FIG. 3. This example demonstrates a process for producing the lead frame of Example 1.

A lead frame 120 of a shaped copper alloy, which has been pretreated for plating, Was first provided (FIG. 3 (a)), and the whole surface thereof was plated with copper to form a 0.1 μm-thick copper plating 130 (FIG. 3 (b)).

In the pretreatment for plating, the whole surface of the lead frame 120, made of a copper alloy, shaped by etching was electrolytically degreased, washed with pure water, and subjected to acid activation treatment for removing the oxide film, formed on the surface of the frame, with an acidic solution, thereby activating the surface of the copper alloy as a lead frame material 120, and again washed with pure water.

Copper plating was performed using copper cyanide at a bath temperature of 50° C. for about 20 sec to a thickness of about 0.1 μm.

Subsequently, a predetermined area of the lead frame 110 plated with copper 130 was plated with silver to form a 3.0 μm-thick partial silver plating 140 (FIG. 3 (c)).

The partial silver plating 140 is generally formed as follows. The lead frame was covered with a masking jig so that a die pad section on the side, where a semiconductor chip to be mounted, and an inner lead front end region for wire bonding to a semiconductor chip are exposed. The lead frame is used as a cathode, and a plating solution is sprayed through a nozzle. In this case, an unnecessary thin silver plating is frequently formed in an area other than the predetermined area. The unnecessary thin silver plated area is called "silver leak area" 140A.

For this reason, the silver leak area 140A was electrolytically removed so that subsequent thin silver plating 150 could be uniformly formed (FIG. 3 (d)).

After the silver leak area 140A was electrolytically removed, the exposed copper plating surface and the whole surface of the partial silver plating in the lead frame were thinly plated with silver to form a 0.01 μm-thick thin silver plating 150 (FIG. 3 (e)).

EXAMPLE 4

Another process for partially plating a lead frame according to the present invention will be briefly described with reference to FIG. 4.

This example demonstrates a process for producing the lead frame of Example 2, and, in the process of this example, unlike the process for partially plating a lead frame described in Example 3, a thin silver plating is formed before the silver plating.

A lead frame 120 of a shaped copper alloy, which has been pretreated for plating, was first provided (FIG. 4 (a)), end the whole surface thereof was plated with copper to form a 0.1 μm-thick copper plating 130 (FIG. 4 (b)).

Subsequently, the whole surface of the lead frame 120 plated with copper 130 was thinly plated with silver 150 to form a 0.01 μm-thick thin silver plating 150 (FIG. 4 (c).

Thereafter, only a predetermined area of the lead frame 120 thinly plated with silver 150 was plated with silver to form a 3.0 μm-thick partial silver plating 140 (FIG. 4 (d)).

The pretreatment for plating, copper plating, silver plating and the like were performed in the same manner as in Example 3.

EXAMPLES 5 AND 6

Embodiments of the semiconductor device according to the present invention will be described with reference to the accompanying drawings.

Figure 7:
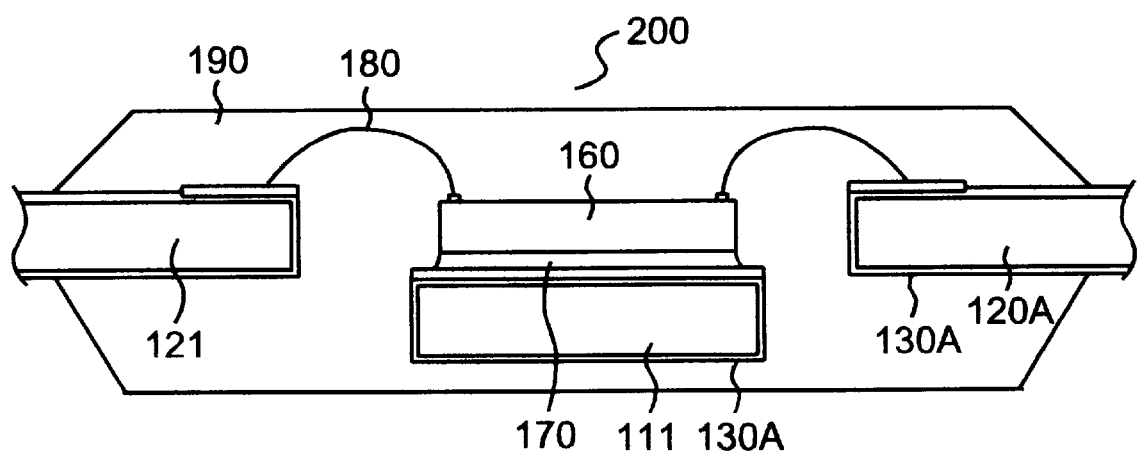
FIG. 7 is a schematic cross-sectional view of a semiconductor device using the lead frame of Example 1 shown in FIG. 5.

In the semiconductor device of Example 5, the lead frame of Example 1 was used, and, as shown in FIG. 5, the semiconductor device was prepared through the step of wire bonding and the step of resin sealing. FIG. 7 is a schematic cross-sectional view of the semiconductor device.

In the semiconductor device of Example 6, the lead frame of Example 2 was used, and, as with Example 5, the semiconductor device was prepared through the step of wire bonding and the step of resin sealing. The semiconductor device of Example 6 is the same appearance as Example 5 shown in FIG. 7. However, these semiconductor devices are different from each other in the thickness of the surface copper oxide film 130A and the area where diffused silver is present.

Both the semiconductor devices of Examples 5 and 6 were free from the occurrence of delamination.

EXAMPLE 7

The reliability for the prevention of delamination in the semiconductor devices thus obtained was examined by the following test.

Specifically, special frames (solid plate) as noted above, for the evaluation of the bond strength of an encapsuling resin were subjected to surface treatment in the same manner as in Examples 1 and 2, and a special frame of the same type as described above was subjected to the conventional surface treatment. The thickness of the copper oxide film and the area where Ag is present, for various heating conditions as indicated, were determined by X-ray photoelectron spectroscopy (ESCA). The bond strength of the resin for each condition was measured in the same manner as described above.

Figure 8A:
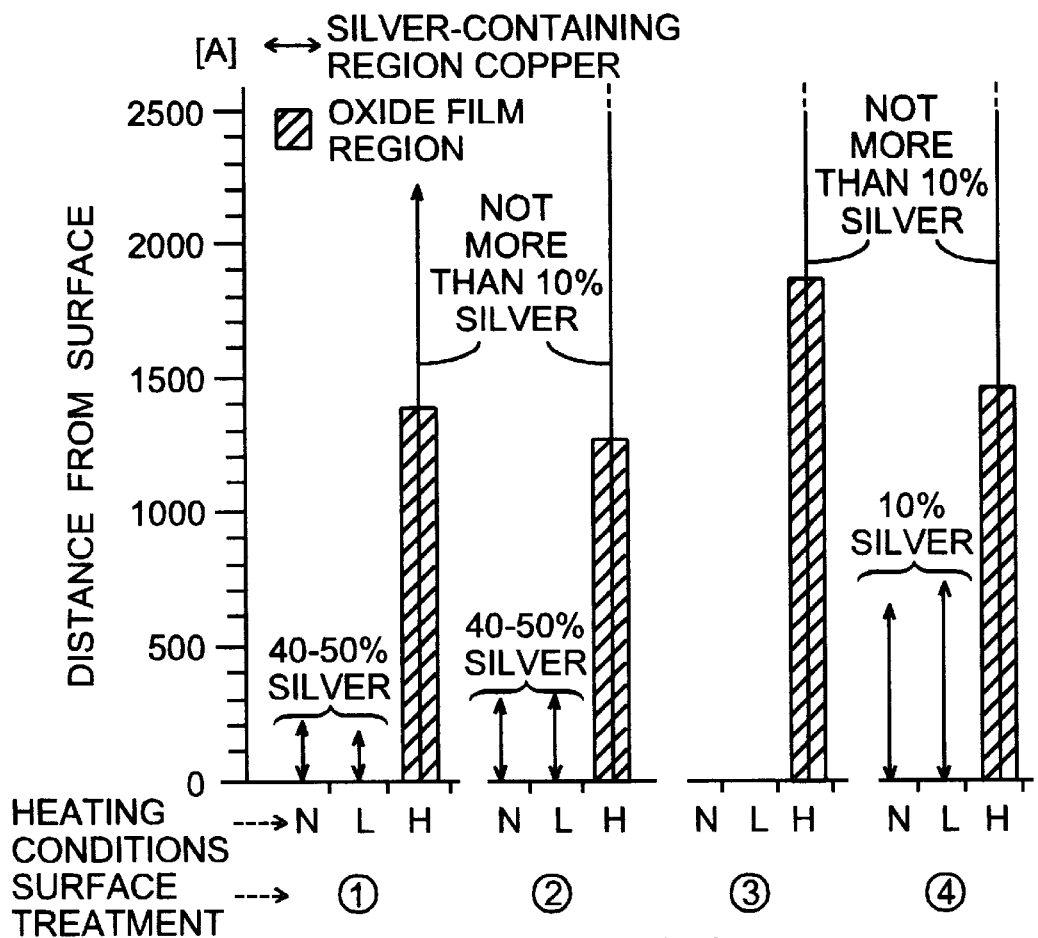
FIG. 8 is a graph illustrating the heat treatment and the bond strength of a resin for a lead frame used in the semiconductor device according to the present invention, wherein FIG. 8 (a) is a graph showing the thickness of the oxide film as measured from the surface and the area, where Ag is present, in terms of the distance from the surface, for the surface treated lead frames heat-treated under varied heating conditions and FIG. 8 (b) is a graph showing the bond strength of the resin after each heat treatment.
Figure 8B:
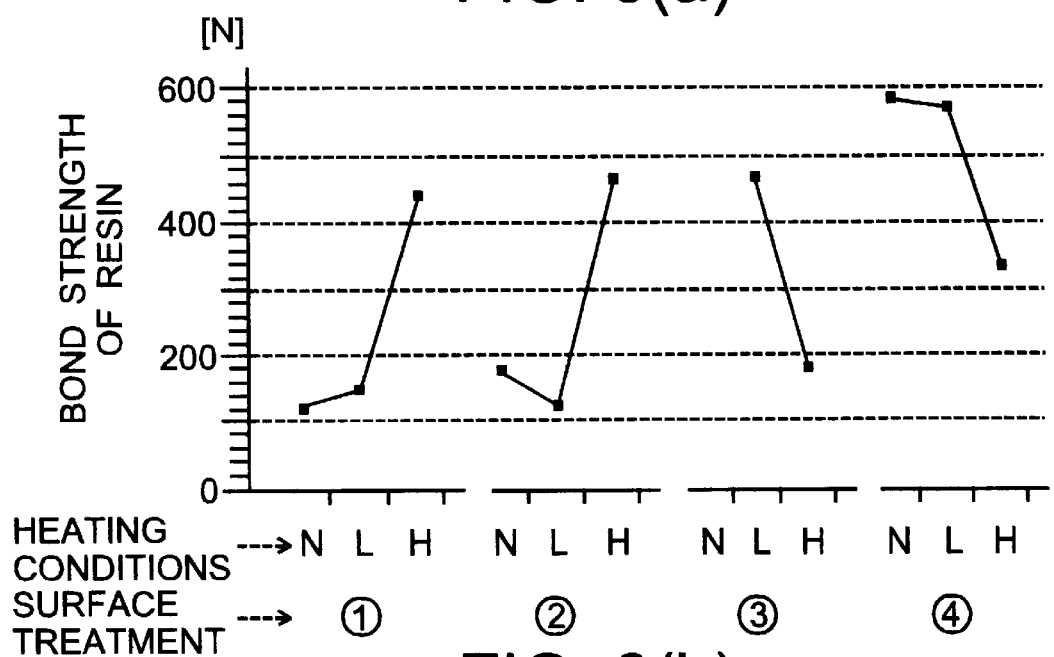

FIG. 8 (a) is a graph showing the thickness of the oxide film as measured from the surface and the area, where Ag is present, in terms of the distance from the surface, for the surface treated lead frames heat-treated under varied heating conditions.

FIG. 8 (b) is a graph showing the bond strength of the resin after heat treatment under conditions as indicated. Heating condition L represents heating at 150° C. for one hr, heating condition H represents heating at 280° C. for 3 min, and heating condition N represents that no heating treatment was carried out.

Regarding the surface treatment conditions of the lead frame, condition (1) represents that the surface treatment was performed in the same manner as described above in connection with the lead frame used in Example 1, condition (2) represents that the surface treatment was performed in the same manner as described above in connection with the lead frame used in Example 2, condition (3) represents that no thin silver plating was not provided with only copper strike plating being applied, and condition (4) represents that a copper-silver alloy plating was provided on the copper material.

From FIG. 8 (b), it is apparent that, after heating treatment corresponding to wire bonding (280° C., 3 min), conditions (1) and (2) involving the presence of Ag over the whole copper oxide film region provide higher bond strength of resin than condition (3) where Ag is not present in the whole copper oxide film region. Further, it is apparent that condition (3), where only a copper oxide film not containing Ag is provided, provides lower bond strength of resin than condition (4).

From these results, the heat treatment of the lead frames used in the semiconductor devices of Examples 5 and 6 under conditions corresponding to wire bonding (280° C., 3 min) provides superior bond strength of resin, indicating that the semiconductor devices of Examples 5 and 6 are less likely to create delamination.

The reason why, as compared with condition (3), condition (4) provides relatively good bond strength of resin after heat treatment corresponding to wire bonding (280° C., 3 min) is believed to reside in that Ag is present in the copper oxide film although it is apart from the surface.

Regarding conditions (1) and (2), several samples were prepared under varied thin silver plating conditions to vary the thickness of the oxide film and the layer containing Ag, and the Ag concentration, and then evaluated. As a result, it was found that a Ag concentration of less than 20 at % as measured by X-ray photoelectron spectroscopy is suitable from the viewpoint of bond strength of resin.

Further, in this case, it was found that heat treatment corresponding to wire bonding (280° C., 3 min) provides a thickness of the oxide film and the film containing Ag of not less than 2000 Å.

Separately, semiconductor devices corresponding respectively to conditions (1) to (4) were prepared to examine the occurrence of delamination. For the occurrence of delamination, it was found that, regarding the bond strength of resin after heat treatment of the lead frame under conditions corresponding to wire bonding (280° C., 3 min), 200 N in condition (3) is unsatisfactory and; condition (4), the occurrence of delamination can be considerably prevented on a level satisfactory for practical use. It was found that, when the bond strength of resin is not less than 400 N provided by conditions (1) and (2), the delamination can be substantially completely prevented.

Further, lead frame samples were prepared in the same manner as in Example 1, except that 0.001 μm-thick, 0.01 μm-thick, 0.1 μm-thick, or 0.5 μm-thick thin palladium plating (hereinafter referred to as "thin Pd plating") was provided instead of the thin silver plating, or a 1.0 μm-thick Pd plating was provided on the copper alloy, or no thin plating was provided as in the prior art. For the samples, the adhesion of the oxide film on the back surface of the die pad and the bond strength of the encapsuling resin were evaluated. The results are shown in Table 2. As is apparent from Table 2, the results obtained from the provision of thin Pd plating given in Table 2 were substantially the same as those obtained from the provision of thin silver plating given in Table 1.

The evaluation method and conditions were the same as those for the provision of thin silver plating given in Table 1.

Although the provision of thin silver plating or thin Pd plating on a lead frame has been described above, it is judged that the provision of thin gold plating or thin platinum plating, or thin plating of silver, Pd (palladium), gold, and platinum, instead of the thin silver plating and thin Pd plating, has the same effect and function.

It is also judged that semiconductor devices using these lead frames have the same effect and function as the semiconductor devices of the above examples.

Further, it is needless to say that the provision of the above thin plating is effective also in the adoption of partial gold plating or partial palladium plating instead of the partial silver plating.

TABLE 2

| Example | Thickness of thin Pd plating, μm | Adhesion of copper oxide film on the back surface of die pad | Adhesion of encapsuling resin |
|---|---|---|---|
| (1) Pd plating on the whole area | 0.001 | ○ | ○ |
| (2) Pd plating on the whole area | 0.01 | ○ | ○ |
| (3) Pd plating on the whole area | 0.1 | ○ | ○ |
| (4) Pd plating on the whole area | 0.5 | ○ | ○ |
| (5) Pd plating on the whole area | 1.0 | ○ | X |
| No Pd plating (conventional example) | No thin Pd plating provided | X | X |

EXAMPLE 8

Figure 9A:
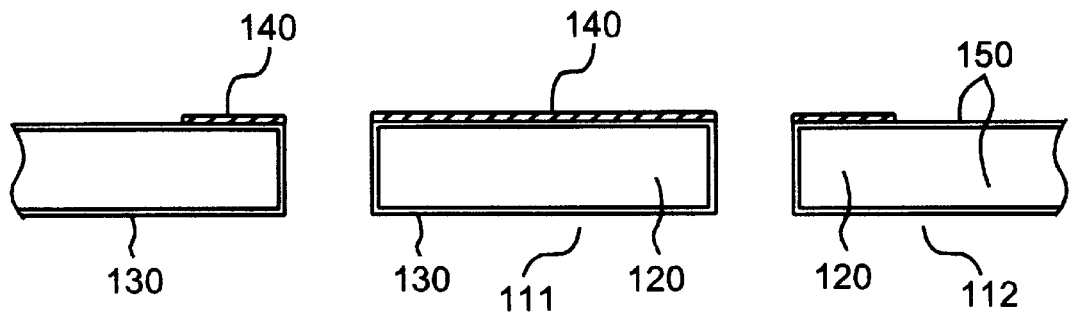
FIG. 9 is a diagram showing a lead frame of Example 8 of the present invention, wherein FIG. 9 (b) is a plan view of the lead frame and FIG. 9 (a) is an enlarged view of the principal part in section taken on line A1–A2 of FIG. 9 (b)
Figure 9B:
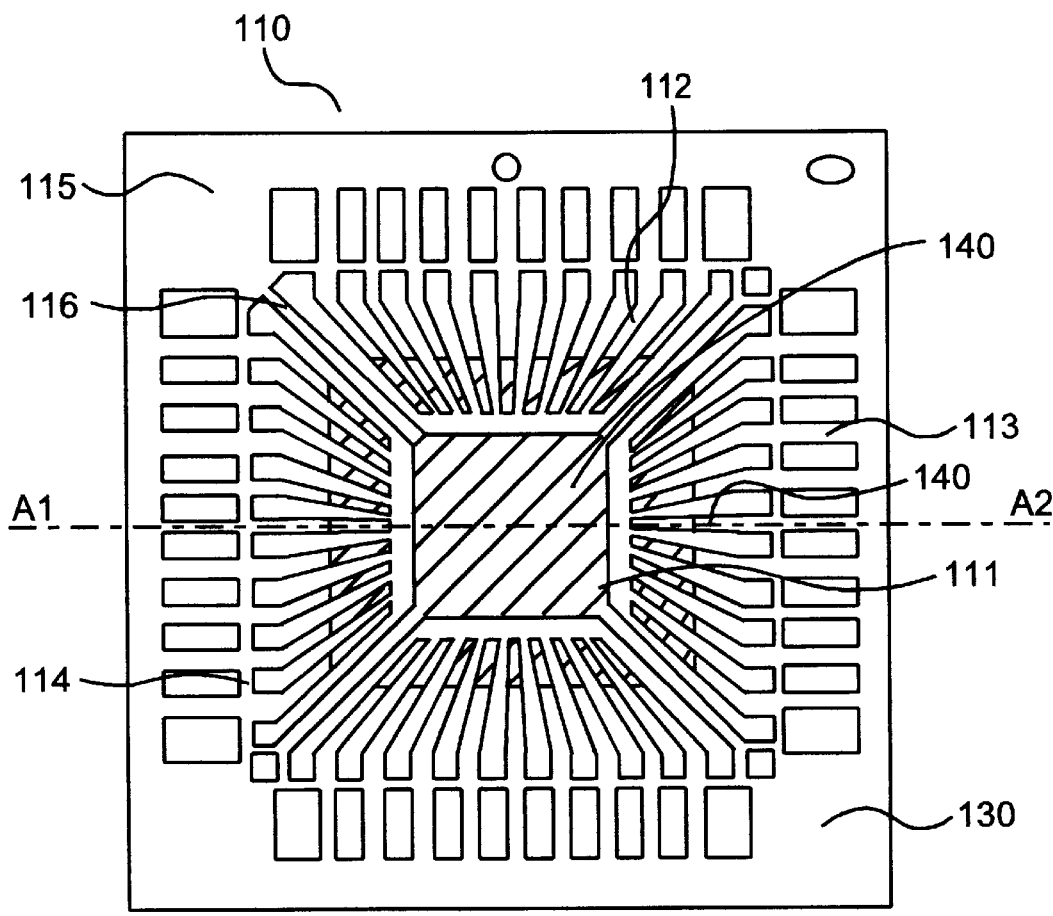

FIG. 9 shows an embodiment of the lead frame of the present invention, wherein FIG. 9 (b) is a plan view of the lead frame and FIG. 9 (a) is an enlarged view of the principal part in section taken on line A1–A2 of FIG. 9 (b).

In FIG. 9, numeral 110 designates a lead frame, numeral 111 a die pad, numeral 112 an inner lead, numeral 113 an outer lead, numeral 114 a dam bar, numeral 115 a frame, numeral 116 a supporting bar, numeral 120 a lead frame material (a copper alloy), numeral 130 a copper plating, numeral 140 a partial silver plating, and numeral 150 a thin silver plating.

In the lead frame 110, a 0.15 mm-thick copper alloy material (EFTEC64T-1/2H material, manufactured by The Furukawa Electric Co., Ltd.) is etched to prepare a lead frame material 120 having an external shape as shown in FIG. 9 (b), a thin silver plating 150 and a copper plating 130 are successively provided on the whole area of the surface of the lead frame, and a predetermined area of the copper plating is plated with silver to form a partial silver plating 140.

In this embodiment, the plating thickness is 0.01 μm for thin silver plating, 0.1 μm for the copper plating, and 3 μm for the partial silver plating. The plating thickness is preferably 0.1 to 0.3 μm for the copper plating, 1.5 to 10 μm for the partial silver plating, and 0.001 to 0.5 μm for the thin silver plating 150.

Further, in this embodiment, EFTEC64T-1/2H material manufactured by The Furukawa Electric Co., Ltd. is used as the lead frame material 120. However, the lead frame material is not limited to this material only, and other copper alloys may be used.

As shown in FIG. 9 (a), in the lead frame according to the present embodiment, after a thin silver plating 150 and a copper plating 130 are successively formed on the whole surface of a shaped lead frame material 120, a partial silver plating 140 is formed on only a predetermined area of the copper plating. The provision of the thin silver plating 150 can improve the adhesion between the base metal (copper alloy material) and the oxide film, enabling the delamination from an encapsuling resin to be prevented in the preparation of a semiconductor device.

EXAMPLE 9

Figure 10A:
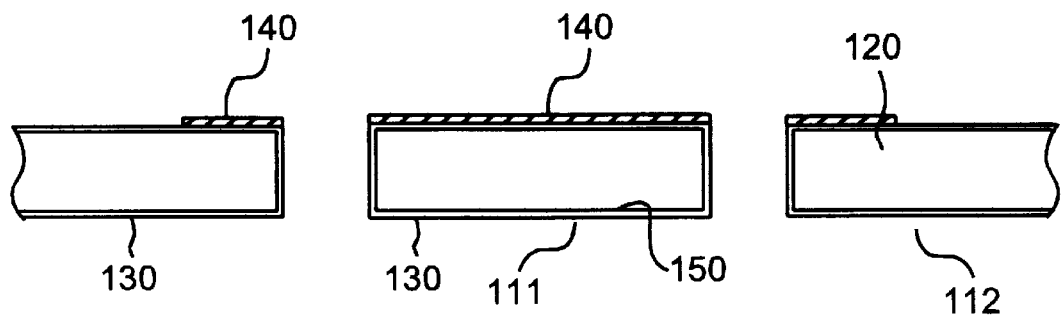
FIG. 10 is a diagram showing a lead frame of Example 9 of the present invention, wherein FIG. 10 (b) is a plan view of the lead frame and FIG. 10 (a) is an enlarged view of the principal part in section taken on line A3–A4 of FIG. 10 (b)
Figure 10B:
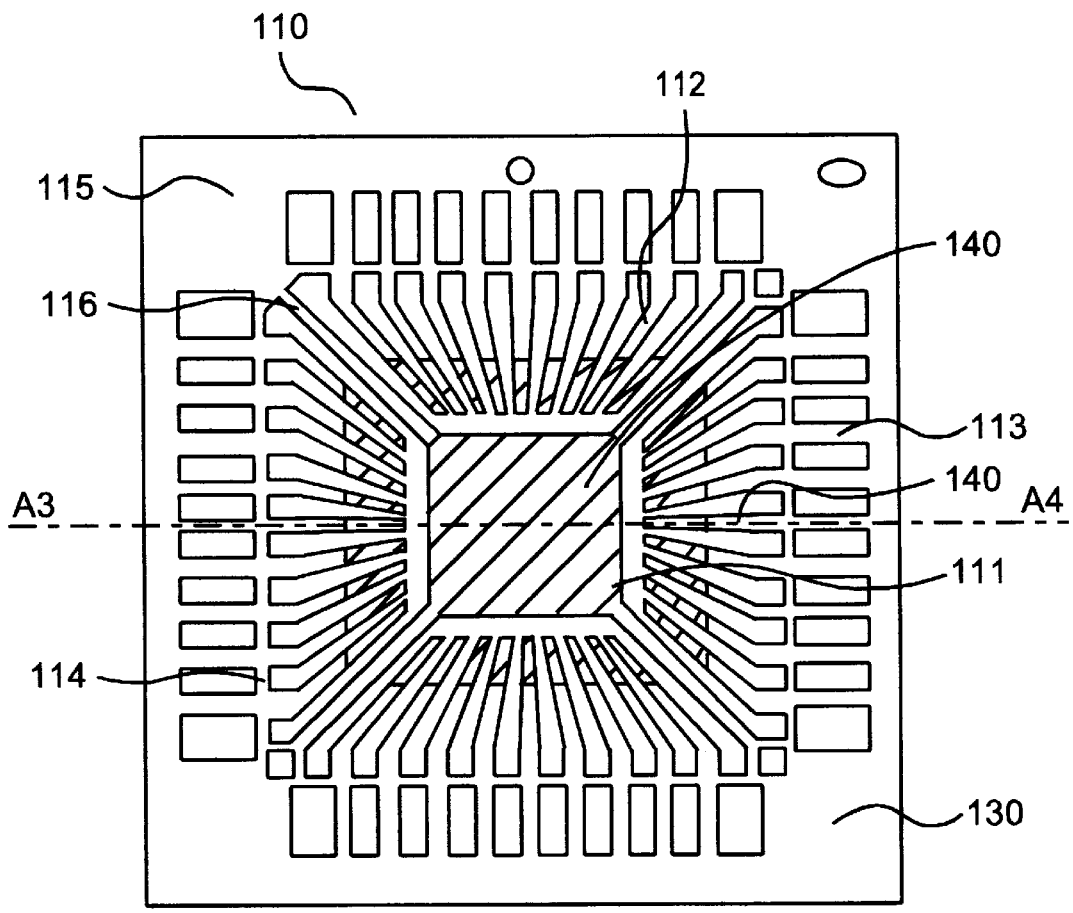
Figure 11A:
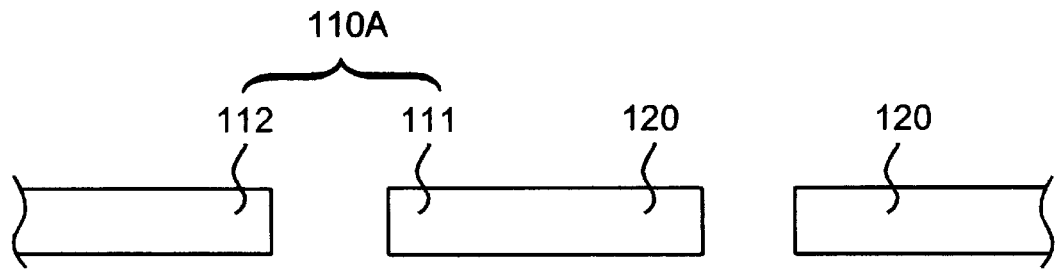
FIG. 11 is a diagram showing steps involved in a method of partially plating a lead frame with a noble metal according to the present invention.
Figure 11B:
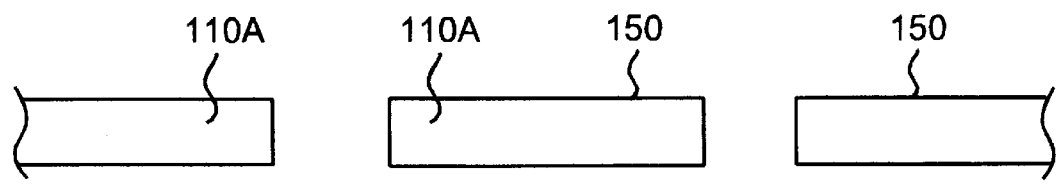
Figure 11C:
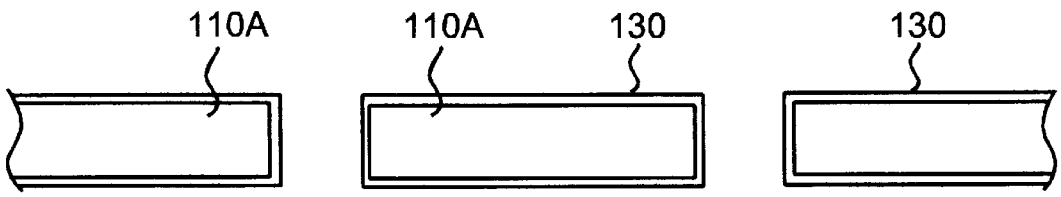
Figure 11D:
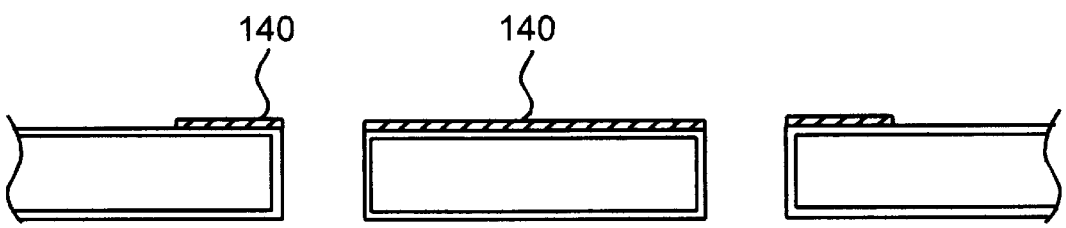

FIG. 10 shows a further embodiment of the lead frame of the present invention, wherein FIG. 10 (b) is a plan view of the lead frame and FIG. 10 (a) is an enlarged view of the principal part in section taken on line A3–A4 of FIG. 10 (b).

In FIG. 10, numeral 110 designates a lead frame, numeral 111 a die pad, numeral 112 an inner lead, numeral 113 an outer lead, numeral 114 a dam bar, numeral 115 a frame, numeral 120 a lead frame material (a copper alloy), numeral 130 a copper plating, numeral 140 a partial silver plating, and numeral 150 a thin silver plating.

The lead frame of the present embodiment is the same as that of Example 8, except that a thin silver plating 150 was provided on only the back surface of a die pad 111 remote from the surface on which a semiconductor chip is mounted.

EXAMPLE 10

The bond strength of a encapsuling resin and the state of peeling of the oxide film were evaluated for lead frames of Examples 8 and 9 and variants and comparative examples.

Lead frames of variants 4, 5 and 6 have the same construction as the lead frame of Example 8, except that the thickness of the thin silver plating was 0.1 μm for variant 4, 0.5 μm for variant 5, and 1.0 μm for variant 6.

Comparative Example 3 is a lead frame, in the conventional example shown in FIG. 6, which has been subjected to anti-discoloration treatment. Comparative Example 4 is a lead frame, in the conventional example, which has subjected to no anti-discoloration treatment.

For all Examples 8 and 9, variants, and comparative examples, the thickness of the copper plating was 0.1 μm, and the thickness of the partial silver plating was 3 μm.

In the evaluation of the bond strength of the encapsuling resin, special frames (a solid plate), for the evaluation of the bond strength of an encapsuling resin, were subjected to surface treatment in the same manner as in Example 8, the variants and the comparative examples, the treated special frames were heated under wire bonding simulated heating conditions of 280° C. and 3 min, an encapsuling resin having a given area was molded on the copper alloy material, and the bond strength of the encapsuling resin was measured by a shear test.

Further, after the test, the state of adhesion of the oxide film to the encapsuling resin, and the peeling of the oxide film from the base material was evaluated. The results are summarized in Table 3.

The bond strength as measured by the shear test and the peeling of the oxide film were evaluated as acceptable (O) when the strength was not less than 2.0 N/mm$^2$, while they were evaluated as unacceptable (X) when the strength was less than 2.0 N/mm$^2$.

TABLE 3

| Example | Thickness of thin Ag plating, μm | Bond strength of sealing resin | Peeling of oxide film |
|---|---|---|---|
| Ex. 8 | 0.01 | ○ | ○ |
| Ex. 9 | 0.01 | ○ | ○ |
| Variant 4 | 0.1 | ○ | ○ |
| Variant 5 | 0.5 | ○ | ○ |
| Variant 6 | 1.0 | X | ○ |
| Comp. Ex. 3 (conventional) (anti-discoloration treatment done) | 0 | X | X |
| Comp. Ex. 4 (anti-discoloration treatment not done) | 0 | ○ | X |

From Table 3, it is apparent that lead frames of Examples 8 and 9 and variants 4 and 5, wherein a thin silver plating has been formed, are superior in bond strength of encapsuling resin and peeling of oxide film to the lead frame of Comparative Example 3 wherein a partial silver plating has been formed by the method shown in FIG. 14(a). Further, it was found that the lead frame of Comparative Example 4 is inferior in peeling of oxide film to the lead frames of Examples 8 and 9 and Variants 4 and 5.

Furthermore, it is apparent that the lead frame of Variant 6 is inferior in bond strength of encapsuling resin to the lead frames of Examples 8 and 9 and Variants 4 and 5, indicating that, when the thickness of the thin silver plating is excessively large, the effect attained by the provision of a thin silver plating is lost.

From these results, it can be judged that, as compared with the conventional lead frame which has been plated by the process shown in FIG. 14 (b), the lead frames of Examples 8 and 9 and Variants 4 and 5 according to the present invention, when used in a semiconductor device, can more effectively prevent the delamination of IC package attributable to the formation of copper oxide film.

EXAMPLE 11

An embodiment of the process for partially plating a lead frame with a noble metal will be described with reference to FIG. 11.

The process for partially plating a lead frame with a noble metal in the present example is a plating process for producing the lead frame of Example 8. FIG. 11 corresponds to FIG. 9 (a).

At the outset, the whole surface of a lead frame 110A of a copper alloy, shaped by etching, was electrolytically degreased with an aqueous alkali solution, washed with pure water, and subjected to acid activation treatment for removing the oxide film, formed on the surface of the frame, with an acidic solution, thereby activating the surface of the copper alloy as a lead frame material 120, and again washed with pure water (FIG. 11 (a)).

Subsequently, the whole surface of the lead frame 110A was thinly plated with silver to form a 0.01 μm-thick thin silver plating 150 (FIG. 11 (b)).

In the thin silver plating, the lead frame was immersed in an aqueous silver cyanide solution and thinly electroplated with silver. In the preparation of the lead frame of Example 9 according to the present invention, a thin silver plating is provided on only the die pad section. Therefore, when plating is conducted, the predetermined area should be masked.

Then, the lead frame was subjected to neutralization with an alkali and acid activation treatment, the surface of the lead frame was washed with pure water, and the whole surface of the lead frame 110A plated with silver was plated with copper cyanide at a bath temperature of 50° C. for about 20 sec to form a 0.1 μm-thick copper plating 130 (FIG. 11 (c)).

Subsequently, the surface of the lead frame 110A with a copper plating 140 provided thereon was washed with pure water, and the whole surface of the lead frame was subjected to anti-silver-replacement treatment in order to prevent the precipitation of silver in an unnecessary area during silver plating.

The anti-replacement treatment was carried out by immersing the lead frame in an organosulfur-based solution at room temperature to form a thin coating.

The lead frame was then covered with a masking jig so that only a die pad section on the side, where a semiconductor chip is mounted, and an inner lead front end region were exposed. The lead frame was used as a cathode, and a plating solution was sprayed through a nozzle. Thus, a 3 μm-thick partial silver plating was formed on the predetermined area. Thereafter, the lead frame was washed with pure water and dried by warm air to prepare a lead frame of the present example (FIG. 11 (d)).

EXAMPLES 12 AND 13

Embodiments of the semiconductor device according to the present invention will be described with reference to the accompanying drawings.

Figure 12A:
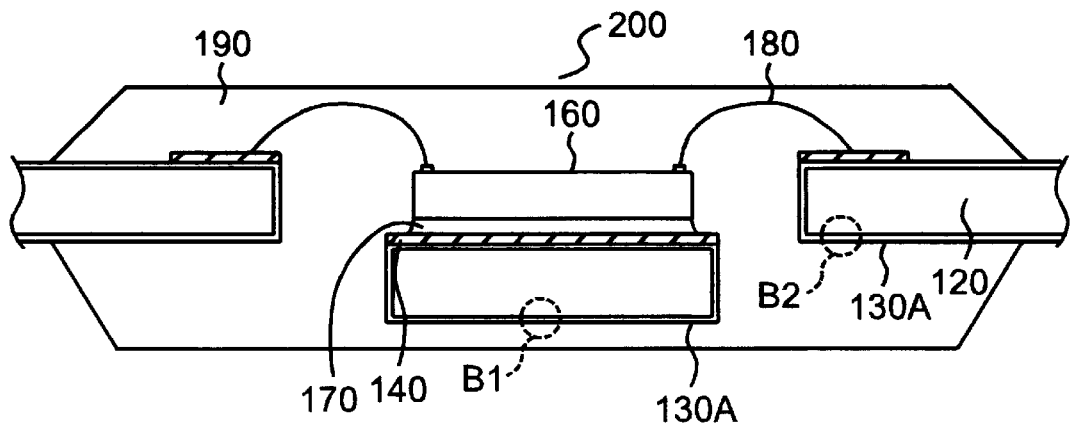
FIG. 12 is a schematic view of a semiconductor device according to the present invention, wherein FIG. 12 (a) is a schematic cross-sectional view of the semiconductor device and FIG. 12 (b) is a cross-sectional view taken on line B1–B2 of FIG. 12 (a)
Figure 12B:
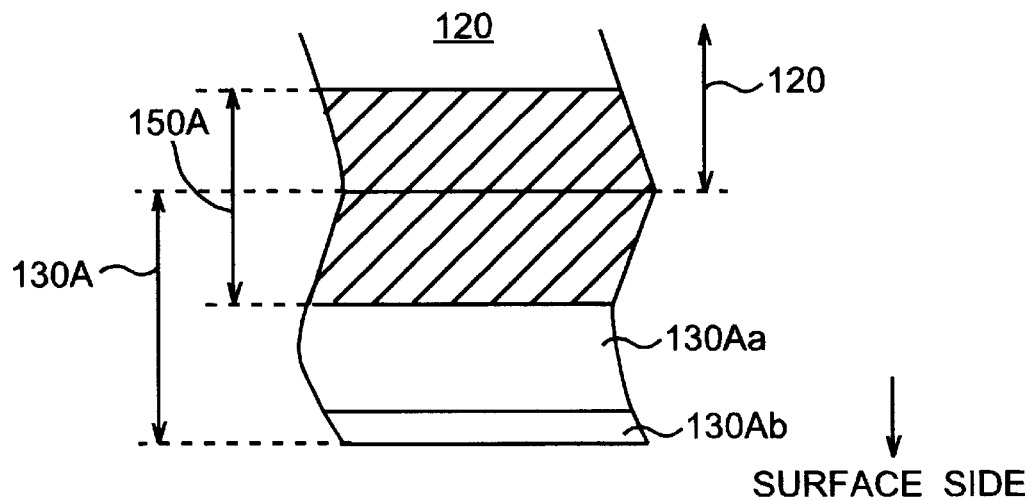
Figure 13A:
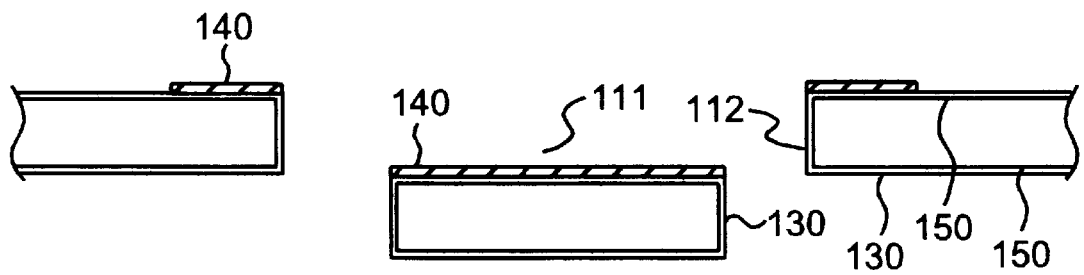
FIG. 13 is an explanatory view illustrating a process for producing a semiconductor device according to the present invention.
Figure 13B:
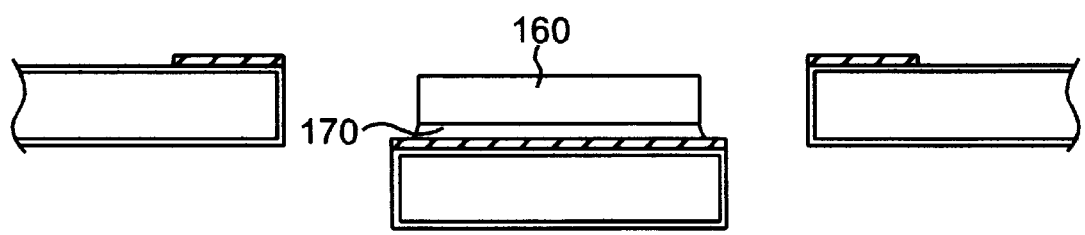
Figure 13C:
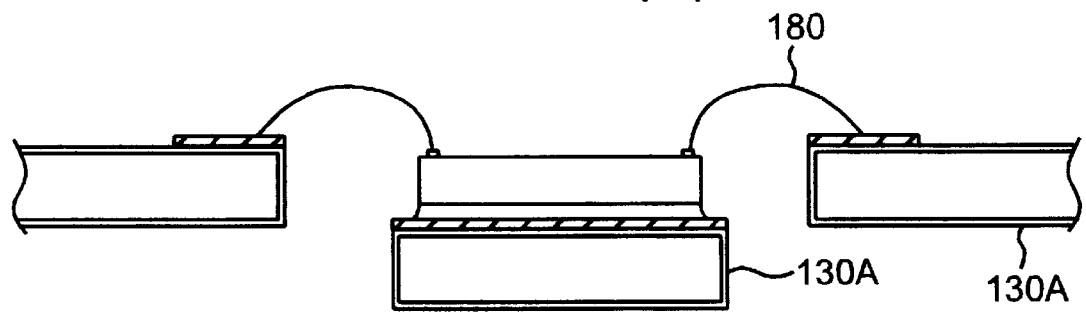
Figure 13D:
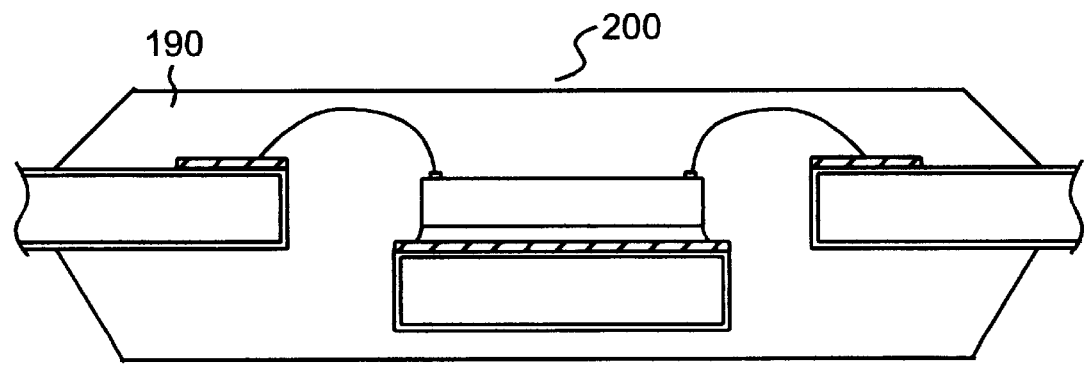

In the semiconductor device of Example 12, the lead frame of Example 8 was used. FIG. 12 (a) is a schematic cross-sectional view of the semiconductor device, and FIG. 12 (b) is an enlarged view in section of B1 and B2 of FIG. 12 (a).

The semiconductor device of Example 12 was prepared through the step of wire bonding shown in FIG. 13 (c) and the step of resin sealing shown in FIG. 13 (d).

In the semiconductor device of Example 13, the lead frame of Example 9 according to the present invention was used, and, as with Example 12, the semiconductor device was prepared through the step of wire bonding and the step of resin sealing. The semiconductor device of Example 13 is the same appearance as Example 12 shown in FIG. 12. However, these semiconductor devices are different from each other in the thickness of the surface copper oxide film and the area where diffused silver is present.

Both the semiconductor devices of Examples 12 and 13 were free from the occurrence of delamination.

EXAMPLE 14

A process for producing a semiconductor device (IC package) using the lead frames of Examples 8 and 9 will be described with reference to FIG. 13.

At the outset, a die pad 111 of a lead frame 110 shown in FIG. 9 is subjected to down setting (FIG. 13 (a)), and a semiconductor chip 160 is joined onto the die pad 111 through a silver paste 170 (FIG. 13 (b)).

Subsequently, the silver paste 170 is heat-cured, and an electrode pad (terminal) 161 of the semiconductor chip 160 is wire-bonded and electrically connected, using a wire (a gold wire) 180, to the front end of an inner lead 112 provided with a partial silver plating 140 in the lead frame 110 (FIG. 13 (c)).

Subsequently, resin sealing, removal of the dam bar, forming of the outer lead, and soldering are performed to prepare a semiconductor device 200 (FIG. 13 (d)).

Through the above steps, the copper plating 130 on the surface of the lead frame 110 shown in FIG. 9 and a part of the lead frame material (copper alloy) 120 are oxidized to form a copper oxide film 130A shown in FIG. 13 (c). At the same time, the thin silver plating 150 underlying the copper plating 130 shown in FIG. 9 is diffused into the copper oxide film 130A and the lead frame material (copper alloy) 120.

In the preparation of the semiconductor device 200 using the lead frame of the present embodiment, upon heating in the step shown in FIG. 13 (c), the surface of copper in the die pad 111 observed by X-ray photoelectron spectroscopy (ESCA) was as shown in FIG. 12 (b).

In FIG. 12 (b), numeral 130A designates a copper oxide film, numeral 150A a region with silver diffused therein, and numeral 120 a lead frame material.

Silver of the thin silver plating 150 shown in FIG. 9 is diffused into the copper oxide film 130A and the copper alloy lead frame material (copper alloy) 120, and, as shown in FIG. 12 (b), a region 150A, where diffused Ag is present, extends over the whole copper oxide film region 130A and a part of the lead frame material (copper alloy) 120. The copper oxide film region 130A is constituted by CuO 130Ab and $Cu_2O$ 130Aa with the CuO 130Ab on the top surface side.

The state of diffusion of Ag into the inner side of the copper oxide film varies depending upon the thickness of the thin silver plating 150 and heating conditions. Silver is diffused into the interior of the copper oxide film. Silver is diffused into the copper oxide film 130A, as well as into the lead frame material (copper alloy) 120.

On the other hand, when a semiconductor device is prepared, through the same steps as shown in FIG. 13, using the conventional lead frame, shown in FIG. 14 (a), with copper plating and partial silver plating alone being provided, the state of oxidation of copper in the step corresponding to FIG. 13 (c) is as shown in FIG. 12 (c).

In the conventional lead frame shown in FIG. 14 (a), since no thin silver plating is provided on the surface of copper, the oxidation rate of copper so high that the thickness of the resultant oxide film is larger than that of the oxide film in the present embodiment. In addition, since there is no diffusion of silver, unlike the use of the lead frame of the present embodiment, preferential formation of $Cu_2O$ over CuO does not occur.

In the lead frames 110 of the embodiments of the present invention shown in FIGS. 9 and 10, by virtue of the provision of the thin silver plating 150, the formation of the copper oxide film 130A is suppressed in the step shown in FIG. 13 (c). That is, it is apparent that, as shown in FIGS. 12 (b) and 12 (c), when semiconductor devices are prepared using the lead frames according to embodiments of the present invention, the thickness of the copper oxide film 130A is smaller than that of the copper oxide film in the case where the conventional lead frame having no thin silver plating was provided.

Further, in the lead frame 110 of the present embodiment, at the time of formation of the copper oxide film 130A, $Cu_2O$ is preferentially formed over CuO, so that the formed copper oxide film per se is less likely to be broken and, consequently, when resin sealing is carried out, the occurrence of delamination from the encapsuling resin can be prevented.

Further, lead frame samples were prepared in the same manner as in Example 8, except that 0.001 μm-thick, 0.01 μm-thick, 0.1 μm-thick, or 0.5 μm-thick thin palladium plating (hereinafter referred to as "thin Pd plating") was provided instead of the thin silver plating, or a 1.0 μm-thick Pd plating was provided on the lead frame material (copper alloy), or no thin plating was provided as in the prior art. For the samples, the adhesion of the oxide film on the back surface of the die pad and the bond strength of the encapsuling resin were evaluated. The results are shown in Table 4. As is apparent from Table 4, the results obtained from the provision of thin Pd plating given in Table 4 were substantially the same as those obtained from the provision of thin silver plating given in Table 3.

The evaluation method and conditions were the same as those for the provision of thin silver plating given in Table 3.

TABLE 4

| Example | Thickness of thin Pd plating, μm | Adhesion of copper oxide film on the back surface of die pad | Adhesion of encapsuling resin |
| --- | --- | --- | --- |
| (1) Pd plating on the whole area | 0.001 | o | o |
| (2) Pd plating on the whole area | 0.01 | o | o |
| (3) Pd plating on the whole area | 0.1 | o | o |
| (4) Pd plating on the whole area | 0.5 | o | o |
| (5) Pd plating on the whole area | 1.0 | o | X |
| No Pd plating (conventional example) | No thin Pd plating provided | X | X |

Although the provision of thin silver plating or thin Pd plating on a lead frame has been described above, it is judged that the provision of thin gold plating or thin platinum plating, instead of the thin silver plating and thin Pd plating, has the same effect and function. Further, it is judged that the provision of a thin plating of a plurality of metals selected from silver, Pd (palladium), gold, and platinum has the same effect and function.

It is also judged that semiconductor devices using these lead frames have the same effect and function as the semiconductor devices of the above examples.

Further, it is needless to say that the provision of the above thin plating is effective also in the adoption of partial gold plating or partial palladium plating instead of the partial silver plating.

EXAMPLE 15

Figure 15A:
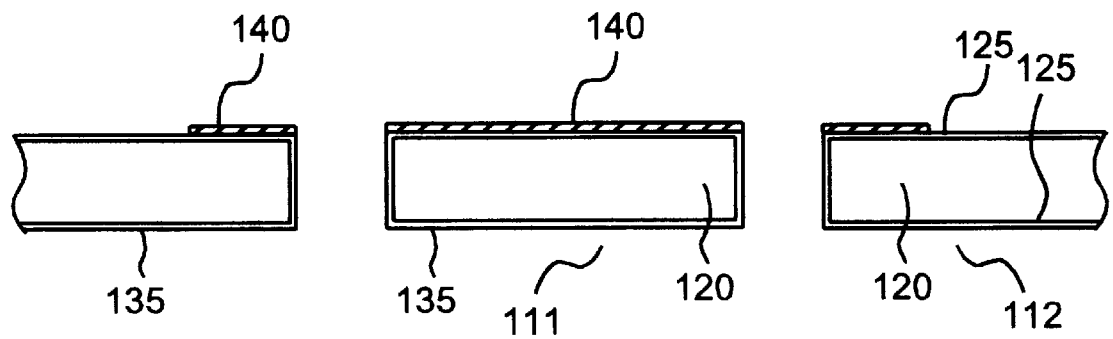
FIG. 15 is a diagram showing an embodiment of the lead frame according to the present invention, wherein FIG. 15 (b) is a plan view of the lead frame and FIG. 15 (a) is an enlarged view of the principal part in section taken on line A1–A2 of FIG. 15 (b)
Figure 15B:
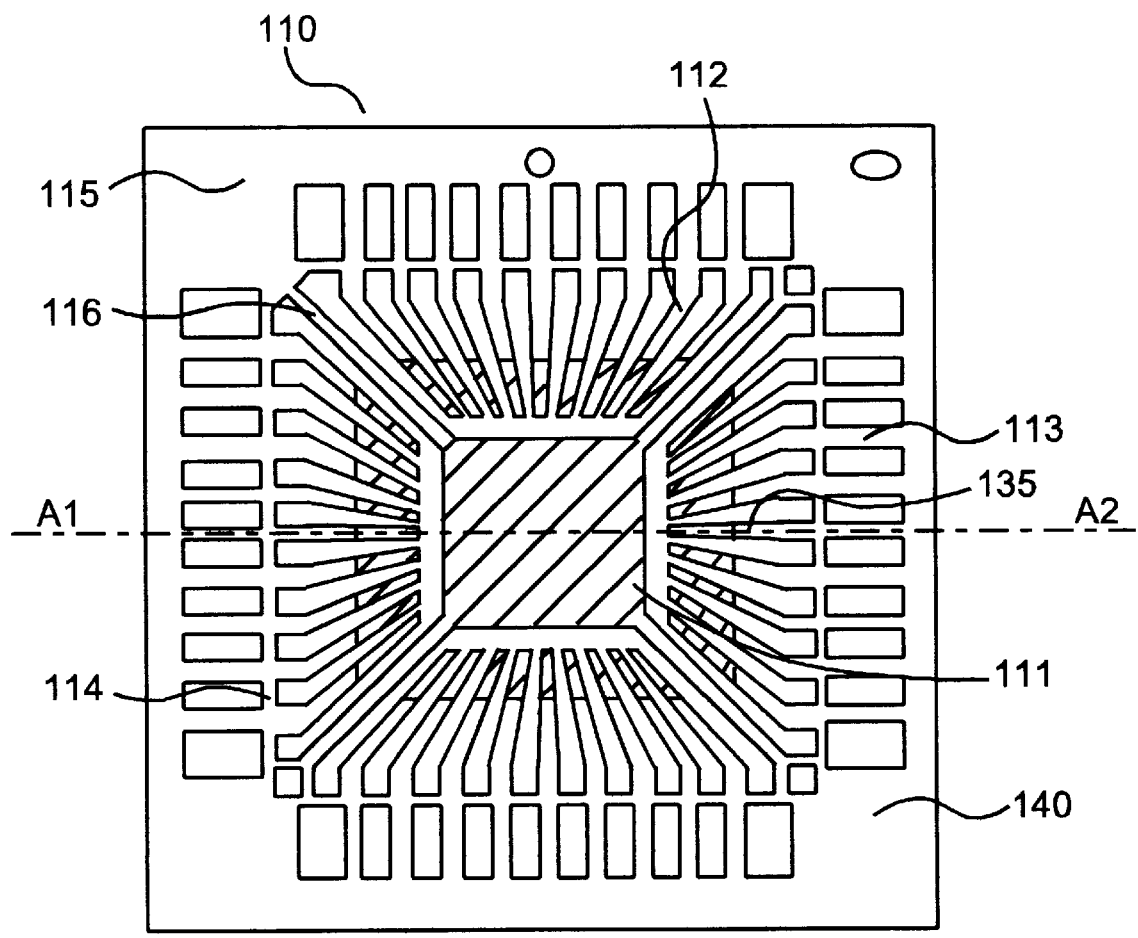

FIG. 15 shows an embodiment of the lead frame of the present invention, wherein FIG. 15 (b) is a plan view of the lead frame and FIG. 15 (a) is an enlarged view of the principal part in section taken on line A1–A2 of FIG. 15 (b).

In FIG. 15, numeral 110 designates a lead frame, numeral 111 a die pad, numeral 112 an inner lead, numeral 113 an outer lead, numeral 114 a dam bar, numeral 115 a frame, numeral 116 a supporting bar, numeral 120 a lead frame material (a copper alloy), numeral 125 a zinc flashing, numeral 135 a copper strike plating, and numeral 140 a partial silver plating.

In the lead frame 110, a 0.15 mm-thick copper alloy material (EFTEC64T-1/2H material, manufactured by The Furukawa Electric Co., Ltd.) is etched to prepare a lead frame material 120 having an external shape as shown in FIG. 15 (b), a zinc flash plating 125 and a copper plating 135 are successively provided on the whole area of the surface of the lead framer and a predetermined area of the copper plating is plated with silver to form a partial silver plating 140.

In this embodiment, the plating thickness is 0.01 μm for zinc flash plating, 0.1 μm for the copper strike plating, and 3 μm for the partial silver plating. The plating thickness is preferably 0.1 to 0.3 μm for the copper strike plating, 1.5 to 10 μm for the partial silver plating, and 0.001 to 0.5 μm for the zinc flash plating 125.

Further, in this embodiment, EFTEC64T-1/2H-material manufactured by The Furukawa Electric Co., Ltd. is used as the lead frame material 120. However, the lead frame material is not limited to this material only, and other copper alloys may be used.

As shown in FIG. 15 (a), in the lead frame according to the present embodiment, after a zinc flash plating 125 and a copper strike plating 135 are successively formed on the whole surface of a shaped lead frame material 120, a partial silver plating 140 is formed on only a predetermined area of the copper strike plating. The provision of the zinc flash plating 125 can improve the adhesion between the base metal (copper alloy) and the oxide film, enabling the delamination from a encapsuling resin to be prevented in the preparation of a semiconductor device.

The mechanism through which the adhesion between the base metal (copper alloy) and the oxide film can be improved has not been elucidated yet. However, it is believed that zinc is diffused into the copper strike plating to prevent the creation of Kirkendall voids, so that the breaking of the oxide film per se is less likely to occur.

The step of plating the lead frame according to the present embodiment will be described with reference to FIG. 17. FIG. 17 corresponds to FIG. 15 (a).

At the outset, the whole surface of a lead frame 110A of a copper alloy, shaped by etching, was electrolytically degreased with an aqueous alkali solution, washed with pure water, and subjected to acid activation treatment for removing the oxide film, formed on the surface of the frame, with an acidic solution, thereby activating the surface of the copper alloy as a lead frame material 120, and again washed with pure water (FIG. 17 (a)).

Subsequently, the whole surface of the lead frame 110A was subjected to zinc flash plating to form a 0.01 μm-thick zinc flash plating 125 (FIG. 17 (b)).

Then, the lead frame was subjected to neutralization with an alkali and acid activation treatment, the surface of the lead frame was washed with pure water, and the whole surface of the lead frame 110A with a zinc flash plating provided thereon was plated with copper cyanide at a bath temperature of 50° C. for about 20 sec to form a 0.1 μm-thick copper strike plating 135 (FIG. 17 (c)).

Subsequently, the surface of the lead frame 110A with a copper strike plating provided thereon was washed with pure water, and the whole surface of the lead frame was subjected to anti-replacement treatment in order to prevent the precipitation of silver in an unnecessary area during silver plating.

The anti-replacement treatment was carried out by immersing the lead frame in a benzotriazole-based solution at room temperature to form a thin coating.

The lead frame was then covered with a masking material so that only a die pad section on the side, where a semiconductor chip is mounted, and an inner lead front end region were exposed. The lead frame was used as a cathode, and a plating solution was sprayed through a nozzle. Thus, a 3 μm-thick partial silver plating was formed on the predetermined area of the lead frame. Thereafter, the lead frame was washed with pure water and dried by warm air to prepare a lead frame of the present example (FIG. 17 (d)).

EXAMPLE 16

Figure 16A:
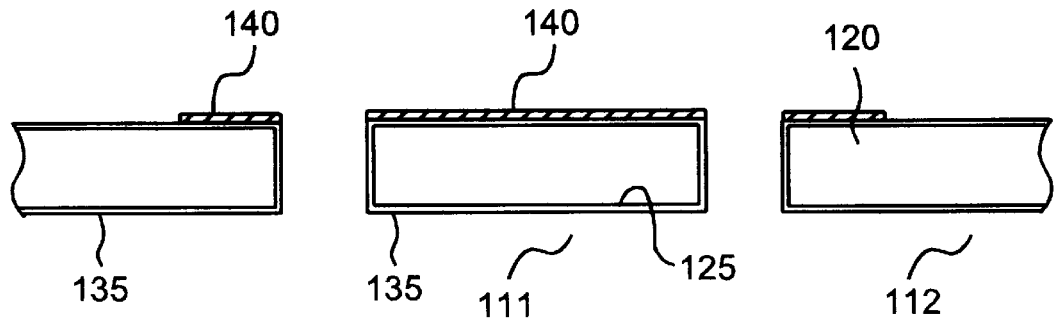
FIG. 16 is another embodiment of the lead frame according to the present invention, wherein FIG. 16 (b) is a plan view of the lead frame and FIG. 16 (a) is an enlarged view of the principal part in section taken on line A3–A4 of FIG. 16 (b)
Figure 16B:
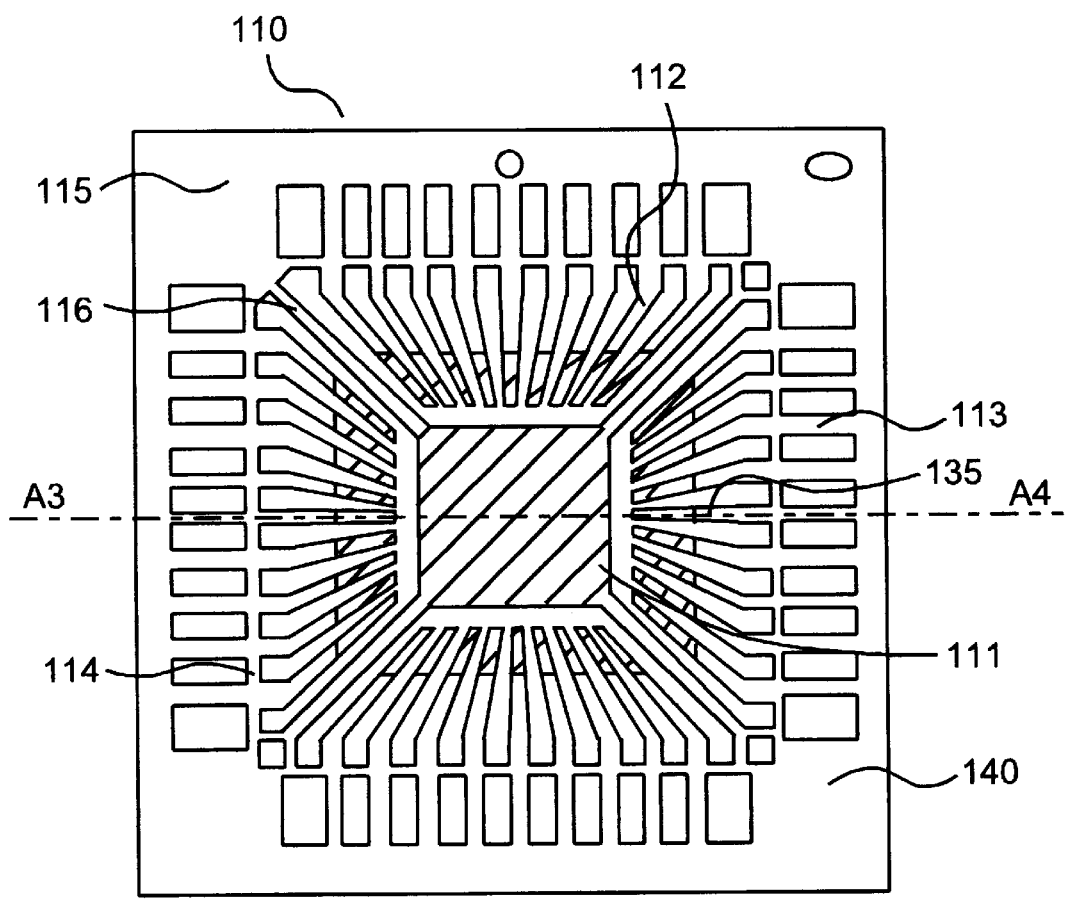
Figure 17A:
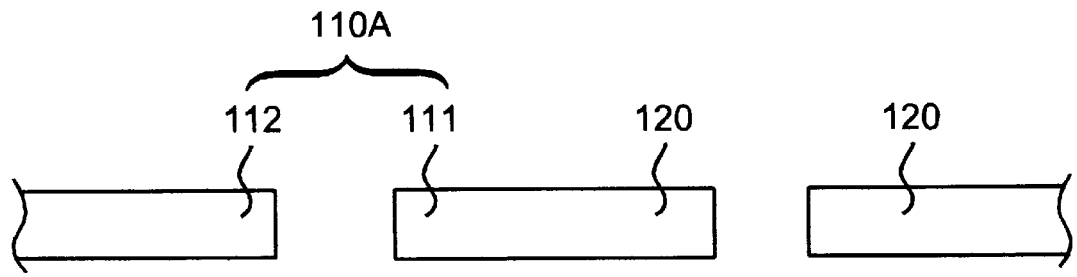
FIG. 17 is a diagram illustrating steps involved in plating of a lead frame according to the present invention.
Figure 17B:
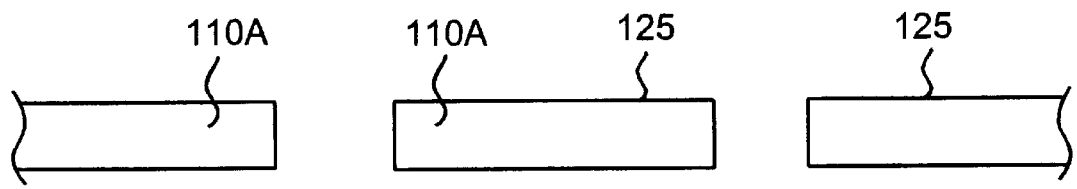
Figure 17C:
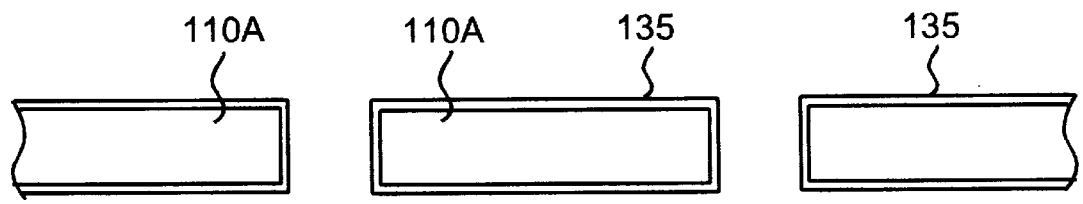
Figure 17D:
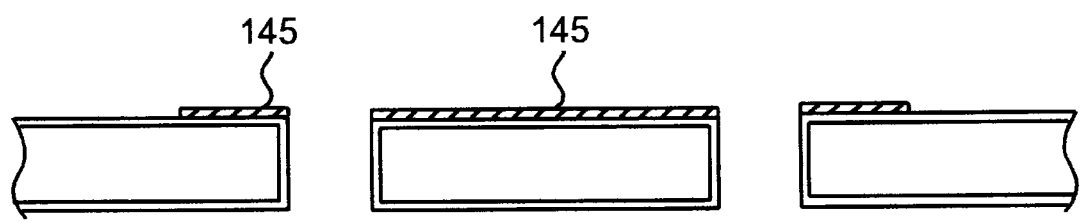

FIG. 16 shows a further embodiment of the lead frame of the present invention, wherein FIG. 16 (b) is a plan view of the lead frame and FIG. 16 (a) is an enlarged view of the principal part in section taken on line A3–A4 of FIG. 16 (b).

In FIG. 16, numeral 110 designates a lead frame, numeral 111 a die pad, numeral 112 an inner lead, numeral 113 an outer lead, numeral 114 a dam bar, numeral 115 a frame, numeral 120 a lead frame material (a copper alloy), numeral 125 a zinc flash plating, numeral 135 a copper strike plating, and numeral 140 a partial silver plating.

The lead frame of the present embodiment is the same as that of Example 15, except that a zinc flash plating 125 was provided on only the back surface of a die pad 111 remote from the surface on which a semiconductor chip is mounted.

Further, the lead frame of the present embodiment can be prepared in the Same manner as described above in connection with the lead frame of Example 15, except that the formation of the zinc flash plating 125 on only the die pad section was carried out using a masking jig in a predetermined form as in the silver plating.

EXAMPLE 17

The bond strength of a encapsuling resin and the state of peeling of the oxide film were evaluated for lead frames of Examples 13 and 16 and variants and comparative examples.

Lead frames of variants 7 and 8 have the same construction as the lead frame of Example 15, and the bond strength of a encapsuling resin and the state of peeling of the oxide film were evaluated for these variants.

Lead frames of variants 7 and 8 have the same construction as the lead frame of Example 15, except that the thickness of the zinc flash plating was 0.1 μm for variant 7 and 0.5 μm for variant 8.

Figure 18:
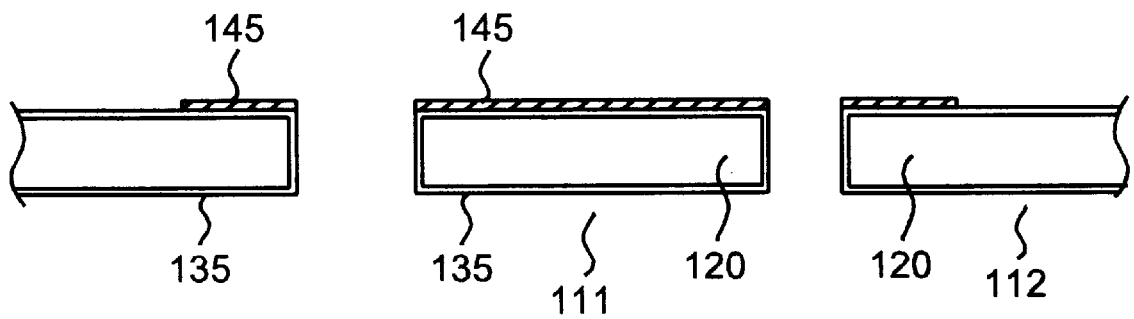
FIG. 18 is a diagram illustrating partial silvering plating of a conventional lead frame.

Comparative Example 5 is a lead frame, in the conventional example shown in FIG. 18, which has been subjected to anti-discoloration treatment. Comparative Example 6 is a lead frame, in the conventional example, which has subjected to no anti-discoloration treatment.

For all Examples 15 and 16, variants, and comparative examples, the thickness of the copper strike plating was 0.1 μm, and the thickness of the partial silver plating was 3 μm.

In the evaluation of the bond strength of the encapsuling resin, special frames (a solid plate), for the evaluation of the bond strength of a encapsuling resin, were subjected to surface treatment in the same manner as in Example 15, the variants and the comparative examples, the treated special frames were heated under wire bonding simulated heating conditions of 280° C. and 3 min, a encapsuling resin having a given area was molded on the copper alloy material, and the bond strength of the encapsuling resin was measured by a shear test.

Further, after the test, the state of adhesion of the oxide film to the encapsuling resin, and the peeling of the oxide film from the base material was evaluated.

The bond strength as measured by the shear test was evaluated as acceptable (O) when the strength was not less than 2.0 N/mm$^2$, while they were evaluated as unacceptable (X) when the strength was less than 2.0 N/mm$^2$.

From Table 5, it is apparent that lead frames of Examples 15 and 16 and variants 7 and 8, wherein zinc flash plating has been conducted, are superior in bond strength of encapsuling resin and peeling of oxide film to the lead frame of Comparative Example 5 wherein a partial silver plating has been formed by the method shown in FIG. 18. Further, it was found that the lead frame of Comparative Example 6 is inferior in peeling of oxide film to the lead frames of Examples 15 and 16 and Variants 7 and 8.

From these results, it can be judged that, as compared with the conventional lead frame which has been plated by the process shown in FIG. 18, the lead frames of Examples 15 and 16 and Variants 7 and 8 according to the present invention, when used in a semiconductor device, can more effectively prevent the delamination of IC package attributable to the formation of copper oxide film.

TABLE 5

| Example | Thickness of thin Ag plating, μm | Bond strength of sealing resin | Peeling of oxide film |
| --- | --- | --- | --- |
| Ex. 15 | 0.01 | o | None |
| Ex. 16 | 0.01 | o | None |
| Variant 7 | 0.1 | o | None |
| Variant 8 | 0.5 | o | None |
| Comp. Ex. 5 (conventional) (anti-discoloration treatment done) | 0 | X | Wholly peeled |
| Comp. Ex. 6 (anti-discoloration treatment not done) | 0 | o | Wholly peeled |

What is claimed is:

1. A lead frame, for a plastic molded type semiconductor device, made of a copper alloy material partially plated with at least one noble metal, for wire bonding or die bonding purposes, selected from the group consisting of silver, gold, and palladium, wherein the whole area or a predetermined area of the surface of the copper alloy material at least on a side of said lead frame to be contacted with an encapsulating resin has a thin noble metal plating of at least one member selected from the group consisting of silver, gold, platinum, and palladium, wherein said thin noble metal plating has a thickness of 0.001 to 0.5 μm and said partial noble metal plating has a thickness of 1.5 to 10 μm.

2. The lead frame according to claim 1, wherein the partial noble metal plating is partial silver plating and the thin noble metal plating is thin silver plating.

3. A semiconductor device comprising a lead frame, for a plastic molded type semiconductor device, comprising a copper alloy material partially plated with at least one noble metal, for wire bonding or die bonding purposes, selected from the group consisting of silver, gold, and palladium, wherein the whole area or a predetermined area of the surface of the copper alloy material at least on a side of said lead frame in contact with an encapsulating resin is coated with a thin noble metal plating selected from the group consisting of silver, gold, platinum, and palladium, wherein said thin noble metal plating has a thickness of 0.001 to 0.5 μm and said partial noble metal plating has a thickness of 1.5 to 10 μm.

4. The semiconductor device according to claim 3, wherein a copper oxide film is formed in the same region as the thin noble metal plating, the concentration of the noble metal in the copper oxide film being not less than 0.1 atomic % and less than 20 atomic % as measured by X-ray photoelectron spectroscopy.

5. A lead frame, for a plastic molded type semiconductor device, made of a copper alloy material partially plated with at least one noble metal, for wire bonding or die bonding purposes, selected from the group consisting of silver, gold, and palladium, a copper strike plating being provided as a primer plating for the partial noble metal plating, wherein the whole area or a predetermined area of the surface of the copper alloy material at least on a side of said lead frame to be contacted with an encapsulating resin has a thin noble metal plating of at least one member selected from the group consisting of silver, gold, platinum, and palladium, the partial noble metal plating being provided on a predetermined area of the copper strike plating, wherein said thin noble metal plating has a thickness of 0.001 to 0.5 μm and said partial noble metal plating has a thickness of 1.5 to 10 μm.

6. The lead frame according to claim 5, wherein the partial noble metal plating is partial silver plating and the thin noble metal plating is thin silver plating.

7. A semiconductor device comprising a lead frame, for a plastic molded type semiconductor device, comprising a copper alloy material partially plated with at least one noble metal, for wire bonding or die bonding purposes, selected from the group consisting of silver, gold, and palladium, a copper strike plating being provided as a primer plating for the partial noble metal plating, wherein the whole area or a predetermined area of the surface of the copper alloy material on at least one of the sides of said lead frame in contact with an encapsulating resin is coated with a thin noble metal plating selected from the group consisting of silver, gold, platinum, and palladium, the copper strike plating being provided on the thin noble metal plating and the partial noble metal plating is provided on a predetermined area of the copper strike plating, wherein said thin noble metal plating has a thickness of 0.001 to 0.5 μm and said partial noble metal plating has a thickness of 1.5 to 10 μm.

8. The semiconductor device according to claim 7, wherein a copper oxide film is formed in the same region as the thin noble metal plating, the concentration of the noble metal in the copper oxide film being not less than 0.1 at % and less than 20 at % as measured by X-ray photoelectron spectroscopy.

9. A lead frame, for a plastic molded type semiconductor device, comprising a copper alloy material, provided with a die pad for mounting a semiconductor chip and partially plated with silver for wire bonding or die bonding purposes, wherein a zinc flash plating and a copper strike plating as primer plating for the silver plating are provided at least on the surface of the copper alloy material on the back surface of the die pad remote from the surface on which the semiconductor chip is mounted, said zinc flash plating being provided on the surface of said copper alloy material and said copper strike plating being provided on said zinc flash plating.

10. The lead frame according to claim 9, wherein the zinc flash plating or the copper strike plating as a primer plating for the silver plating is provided on the whole surface of the lead frame.

11. The lead frame according to claim 9, wherein the thickness of the zinc flash plating is not less than 0.001 µm and not more than 0.5 µm.

* * * * *